(12) United States Patent
Nakaya et al.

(10) Patent No.: US 11,699,614 B2
(45) Date of Patent: *Jul. 11, 2023

(54) FILM DEPOSITION METHOD AND PLASMA PROCESSING APPARATUS

(71) Applicant: Tokyo Electron Limited, Tokyo (JP)

(72) Inventors: Michiko Nakaya, Miyagi (JP); Masanobu Honda, Miyagi (JP)

(73) Assignee: Tokyo Electron Limited, Tokyo (JP)

( * ) Notice: Subject to any disclaimer, the term of this patent is extended or adjusted under 35 U.S.C. 154(b) by 185 days.

This patent is subject to a terminal disclaimer.

(21) Appl. No.: 15/897,467

(22) Filed: Feb. 15, 2018

(65) Prior Publication Data

US 2018/0247858 A1 Aug. 30, 2018

(30) Foreign Application Priority Data

Feb. 28, 2017 (JP) ................. 2017-036890

(51) Int. Cl.
| | |
|---|---|
| *H01L 21/762* | (2006.01) |
| *H01L 21/67* | (2006.01) |
| *H01L 21/02* | (2006.01) |
| *H01L 21/683* | (2006.01) |
| *C23C 16/505* | (2006.01) |
| *H01J 37/32* | (2006.01) |

(52) U.S. Cl.
CPC ...... *H01L 21/76224* (2013.01); *C23C 16/505* (2013.01); *H01J 37/32449* (2013.01); *H01J 37/32816* (2013.01); *H01L 21/0212* (2013.01); *H01L 21/02205* (2013.01); *H01L 21/02274* (2013.01); *H01L 21/67017* (2013.01); *H01L 21/67103* (2013.01); *H01L 21/6833* (2013.01); *H01J 2237/332* (2013.01); *H01L 21/0217* (2013.01); *H01L 21/02118* (2013.01)

(58) Field of Classification Search
None
See application file for complete search history.

(56) References Cited

U.S. PATENT DOCUMENTS

| | | | |
|---|---|---|---|
| 5,358,902 A | 10/1994 | Verhaar et al. | |
| 5,525,550 A * | 6/1996 | Kato ................ | H01L 21/022 438/788 |
| 10,049,921 B2 | 8/2018 | Draeger et al. | |
| 2004/0106293 A1 | 6/2004 | Igarashi | |

(Continued)

FOREIGN PATENT DOCUMENTS

| | | |
|---|---|---|
| CN | 105390437 | 3/2016 |
| JP | 3086234 | 9/2000 |

(Continued)

*Primary Examiner* — Joel G Horning
(74) *Attorney, Agent, or Firm* — IPUSA, PLLC

(57) ABSTRACT

A film deposition method includes maintaining an inside of a chamber to have a predetermined pressure, cooling a stage, on which the object to be processed mounts, to have an ultralow temperature of −20° C., and mounting the object to be processed on the stage, supplying a gas including a low vapor pressure material gas of a low vapor pressure material into the inside of the chamber, and generating plasma from the supplied gas including the gas of the low vapor pressure material, and causing a precursor generated from the low vapor pressure material by the plasma to be deposited on a recess part of the object to be processed.

13 Claims, 19 Drawing Sheets

(56) References Cited

U.S. PATENT DOCUMENTS

| | | |
|---|---|---|
| 2005/0011859 A1 | 1/2005 | Ji et al. |
| 2007/0287296 A1 | 12/2007 | Chang |
| 2010/0215460 A1 | 8/2010 | Watanabe et al. |
| 2016/0056071 A1 | 2/2016 | Draeger et al. |
| 2016/0314964 A1 | 10/2016 | Tang et al. |

FOREIGN PATENT DOCUMENTS

| | | |
|---|---|---|
| JP | 2004-031888 | 1/2004 |
| JP | 2004-228581 | 8/2004 |
| JP | 2008-140998 | 6/2008 |
| JP | 2010-153859 | 7/2010 |
| JP | 2015-046449 | 3/2015 |
| JP | 2015-065396 | 4/2015 |
| JP | 2015-149410 | 8/2015 |
| JP | 2015-530742 | 10/2015 |
| JP | 2016-103595 | 6/2016 |
| WO | 2014/025507 | 2/2014 |

* cited by examiner

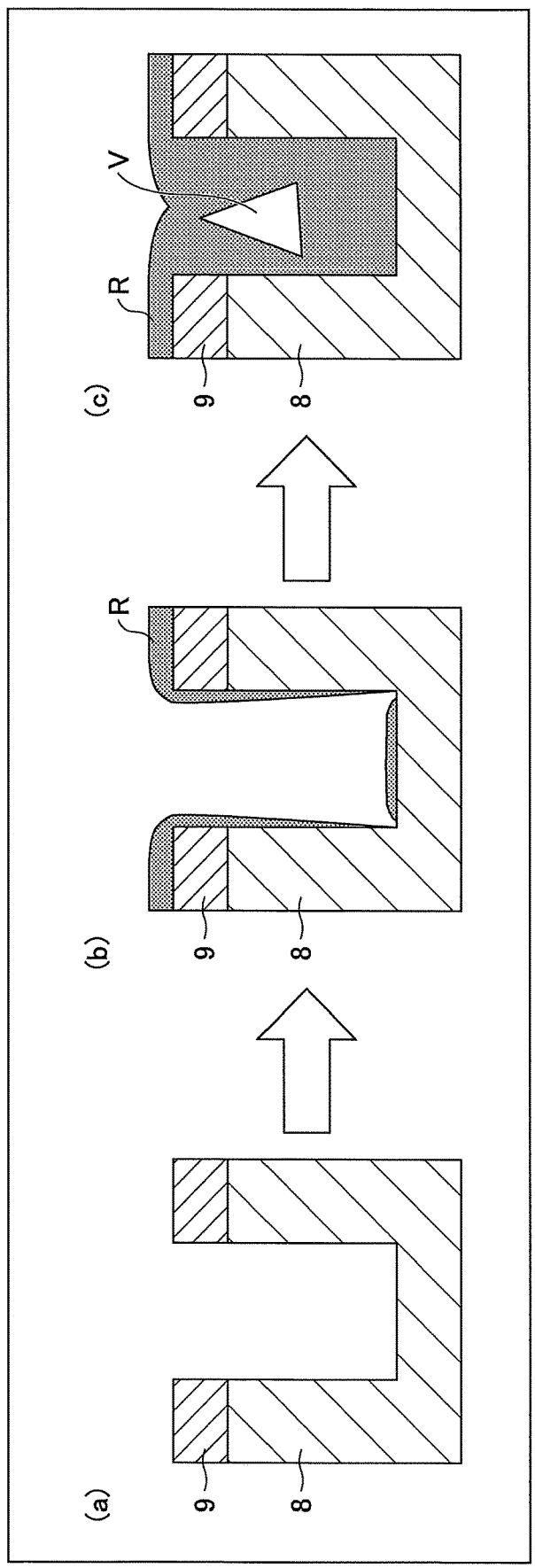

FIG.7

| CONDITION \ TEMPERATURE | -50 °C | -40 °C | -30 °C | -20 °C | -10 °C |
|---|---|---|---|---|---|
| (a) 100 mT C$_4$F$_6$ 300 sccm | OK | — | OK | NG(WITH VOID) | NG(WITH VOID) |
| (b) 50 mT IPA (C$_3$H$_8$O) 75 sccm | OK | OK | NG(WITH VOID) | — | NG(WITH VOID) |
| (c) 50 mT C$_4$F$_6$ 300 sccm | OK | — | OK | OK | NG(WITH VOID) |
| (d) 50 mT C$_4$F$_6$ 125 sccm | — | — | OK | NG(WITH VOID) | NG(WITH VOID) |

FIG.9

| STRUCTURAL FORMULA | $C_4F_6$ F-C=C-C=C-F F F | IPA($C_3H_8O$) H H H-C-C-C-H H OH H | $C_4F_8$ F-C-C-C-C-F F F F F | $CH_4$ H-C-H H | $CH_3F$ H-C-F H | $CF_4$ F-C-F F |
|---|---|---|---|---|---|---|
| −50 °C PROFILE | 1 R | 1 R | 1 R | 1 V R | 1 V R | 1 |
| GAP FILL OK OR NG | OK | OK | OK | NG(WITH VOID) | NG(WITH VOID) | NG(NO DEPOSITION) |
| GAP FILL UPPER LIMIT TEMPERATURE | −20 °C | −40 °C | −30 °C | — | — | — |

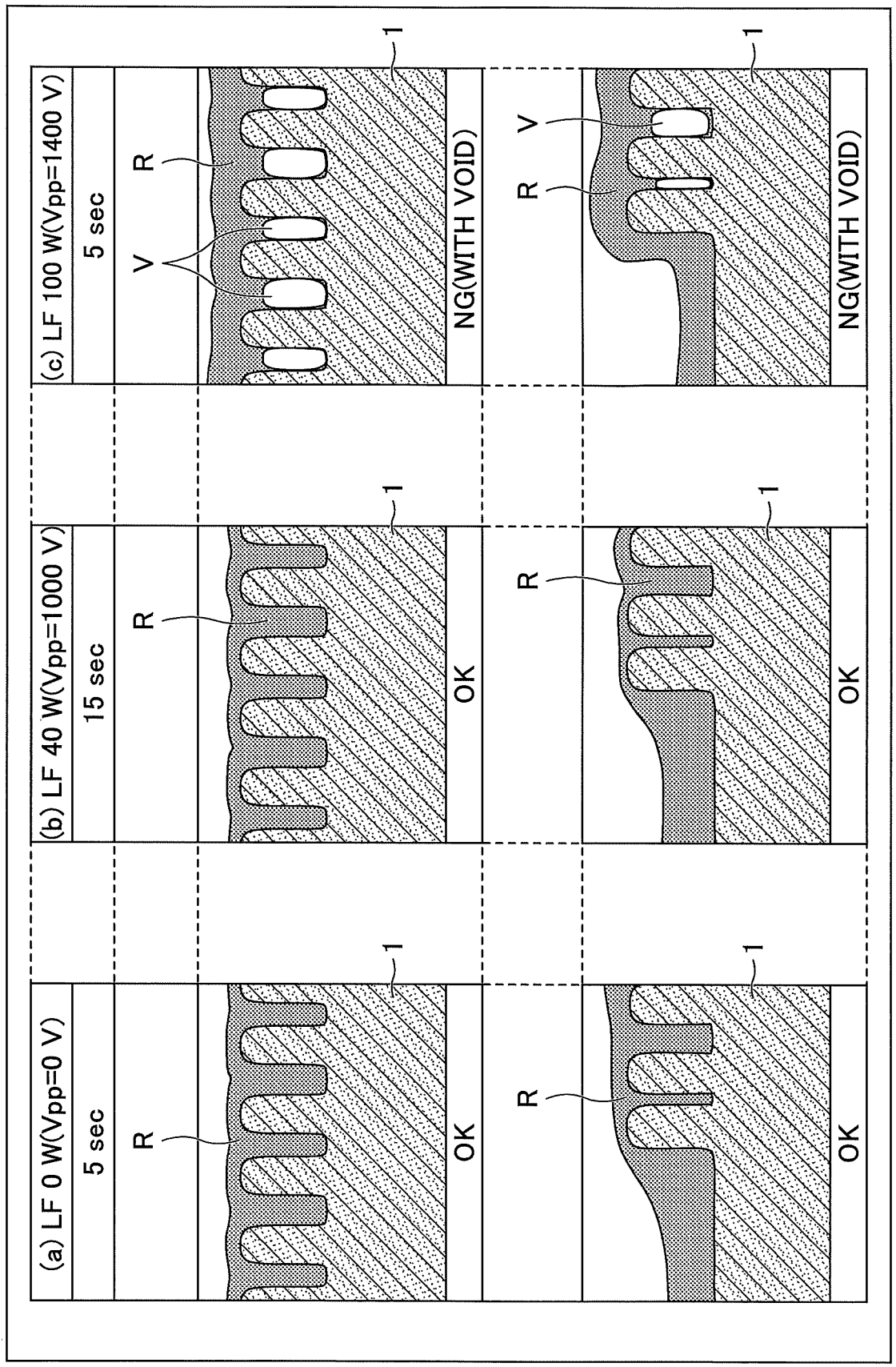

FILM DEPOSITION METHOD AND PLASMA PROCESSING APPARATUS

CROSS-REFERENCE TO RELATED APPLICATIONS

This patent application is based upon and claims the benefit of priority of Japanese Patent Application No. 2017-036890 filed on Feb. 28, 2017, the entire contents of which are incorporated herein by reference.

BACKGROUND OF THE INVENTION

1. Field of the Invention

The present invention generally relates to a film deposition method and a plasma processing apparatus.

2. Description of the Related Art

In recent years, the dimensions of a semiconductor device becomes minute, and an aspect ratio (A/R) of a hole or a groove in a line and space (L/S) is increasing. It is proposed to embed an inside of the recess part having such a high aspect ratio with a predetermined film so as not to cover the opening of the top of the recess part as described in Patent Documents 1 and 2.

[Patent Document 1] United States Laid-open Patent Application Publication No. 2016/0314964

[Patent Document 2] Japanese Translation of PCT International Application Publication No. 2015-530742

[Patent Document 3] Japanese Laid-open Patent Application Publication No. 2010-153859

[Patent Document 4] Japanese Laid-open Patent Application Publication No. 2004-228581

SUMMARY OF THE INVENTION

However, in a case where a film is formed inside a recess part by plasma generated from a gas of fluorocarbon, as the aspect ratio becomes higher, the opening at the top of the recess part is covered to cause a cavity inside the recess part. Then, it becomes difficult to completely fill the inside of the recess part with the film.

According to an aspect of the present invention, the recess part of the object to be processed is embedded by a predetermined deposited material.

There is provided a film deposition method including maintaining an inside of a chamber to have a predetermined pressure, cooling a stage, on which the object to be processed mounts, to have an ultralow temperature of −20° C., and mounting the object to be processed on the stage; supplying a gas including a low vapor pressure material gas of a low vapor pressure material into the inside of the chamber; and generating plasma from the supplied gas including the gas of the low vapor pressure material, and causing a precursor generated from the low vapor pressure material by the plasma to be deposited on a recess part of the object to be processed.

Additional objects and advantages of the embodiments are set forth in part in the description which follows, and in part will become obvious from the description, or may be learned by practice of the invention. The objects and advantages of the invention will be realized and attained by means of the elements and combinations particularly pointed out in the appended claims. It is to be understood that both the foregoing general description and the following detailed description are exemplary and explanatory and are not restrictive of the invention as claimed.

BRIEF DESCRIPTION OF THE DRAWINGS

FIG. 2 illustrates an example of blockage of an opening of a recess according to the present invention;

FIG. 7 illustrates examples of test results of time changes of a film by a film deposition method according to the present invention;

FIG. 9 illustrates examples of test results of gas dependence of a film by a film deposition method according to the present invention;

DETAILED DESCRIPTION OF EMBODIMENTS

A description of embodiments of the present invention is given below, with reference to the FIG. 1 through FIG. 14B.

The embodiments described below are only examples and the present invention is not limited to the embodiments.

Through all figures illustrating the embodiments, the same references symbols are used for portions having the same function, and repetitive explanations of these portions are omitted.

The reference symbols typically designate as follows.

5: inductively-coupled type plasma processing apparatus;
10: chamber;
12: stage;
20: baffle plate;
26: evacuation device;
30: second high frequency power source;
36: electrostatic chuck;
40: direct power source;
44: refrigerant room;
52: dielectric window;
54: RF antenna;
56: first high frequency power source;
64: gas discharge port;
66: gas supply source; and
74: control unit.

[Plasma Processing Apparatus]

Figure 1:
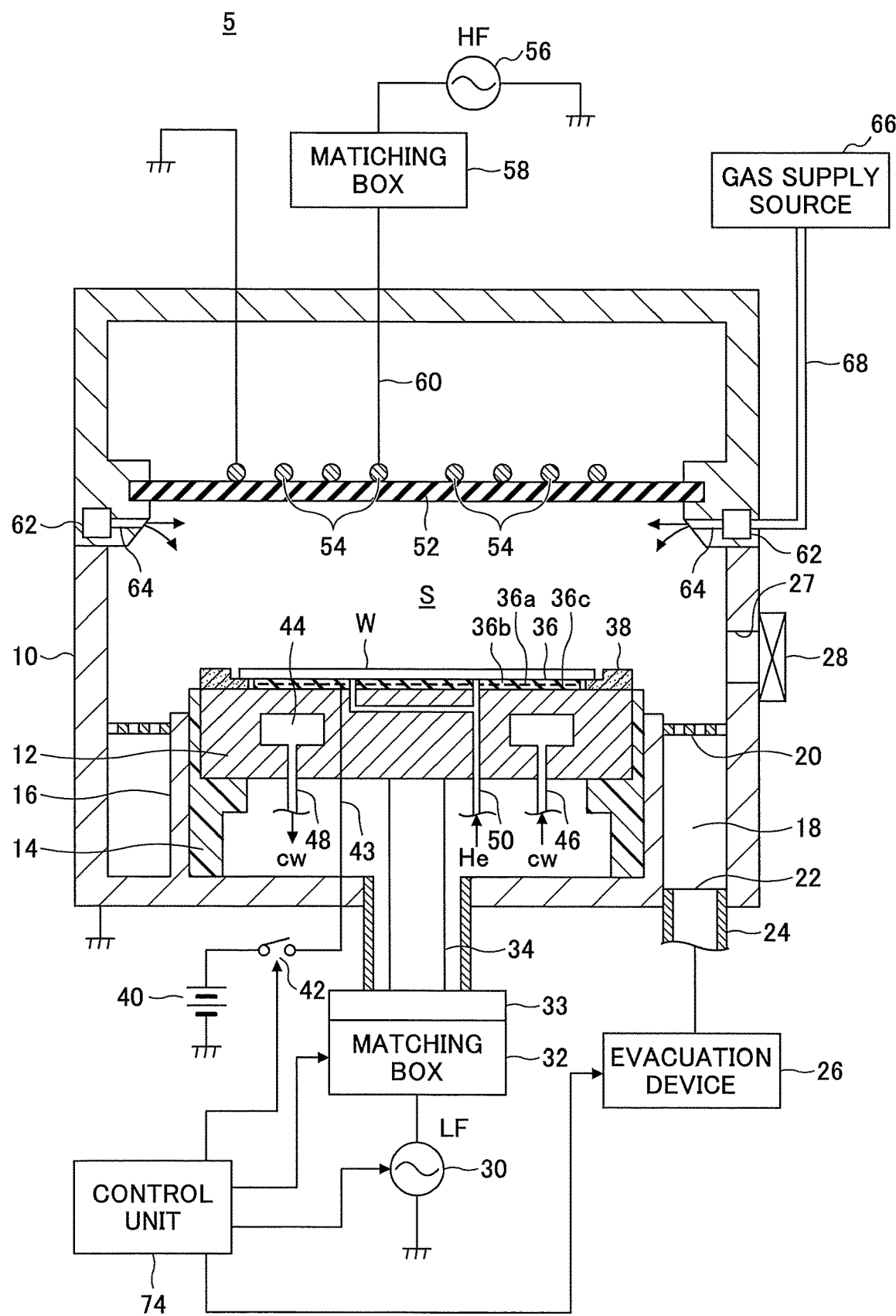
FIG. 1 is an example of a plasma process apparatus according to the present invention.

At first, referring to FIG. 1, an example of a structure of a plasma processing apparatus of an embodiment of the present invention is described. FIG. 1 illustrates an example of a structure of the plasma processing apparatus of the embodiment. Within the embodiment, an inductively coupled plasma processing apparatus 5 is exemplified as a plasma processing apparatus.

Within the embodiment, this inductively-coupled plasma processing apparatus 5 is formed as a plasma processing apparatus using an RF antenna having a planar coil shape and includes a cylindrical vacuum chamber 10 made of a metal such as aluminum and stainless steel. The chamber 10 is electrically grounded for safety.

For example, a disk-like stage 12 mounting a semiconductor wafer (hereinafter, referred to as a "wafer W") is horizontally arranged as a substrate holding seat, which also works as a high frequency electrode, in a lower middle inside the chamber 10. This stage 12 is made of, for example, aluminum and supported by an insulative cylindrical supporting portion 14, which vertically extends from the bottom of the chamber 10.

An annular evacuation path 18 is formed between a conductive cylindrical supporting portion 16 extending in a vertical upward direction from the bottom of the chamber 10 along the outer periphery of the insulative cylindrical supporting portion 14.

A baffle plate 20 in an annular shape is attached to an upper portion or an inlet of the annular evacuation path 18. An evacuation port 22 is provided in a bottom part. It is preferable to provide a plurality of evacuation ports 22 at equal intervals in the peripheral direction of the stage 12 to make a gas flow inside the chamber 10 uniform for the wafer W on the stage 12 relative to an axis of the stage 12.

The evacuation device 26 is connected to the evacuation ports 22 via the evacuation tubes 24. The evacuation device 26 includes a vacuum pump such as a turbo-molecular pump so as to depressurize the plasma processing space in the chamber 10 to be a desired degree of vacuum. A gate valve 28 for opening and closing a transfer port 27 for carrying in and out the wafer W is provided outside a sidewall of the chamber 10.

A second high frequency power source 30 is electrically connected to the stage 12 through a matching box 32 and a feed rod 34. This second high frequency power source 30 is provided to output variable power of the high frequency power LF for pulling in a bias of a constant frequency (for example, 400 kHz) suitable for controlling the energy of ions pulling into the wafer W. The matching box 32 accommodates a matching circuit of a variable reactance for matching between an impedance on a side of the second high frequency power source 30 and an impedance on a side of a load (mainly, the stage, plasma, and the chamber). A blocking capacitor for generating an auto-bias is included in this matching circuit. A voltage measuring unit 33 is disposed between the matching box 32 and the feed rod 34. The voltage measuring unit 33 measures a voltage Vpp (the amplitude of a sine wave of a voltage to be actually applied: peak-to-peak) actually applied to the stage 12 in a case where high frequency power for pulling in the bias is applied from the second high frequency power source 30 to the stage 12 during plasma generation. Said differently, the voltage measuring unit 33 measures ion energy to be pulled into the wafer W.

An electrostatic chuck 36 for holding the wafer W is provided on the upper surface of the stage 12. A focus ring 38 annularly surrounding the periphery of the wafer W is disposed on an outer peripheral side of the electrostatic chuck 36. The electrostatic chuck 36 is formed by interposing an electrode 36a made of a conductive film between a pair of insulating films 36b and 36c. A high voltage direct power source 40 is electrically connected through a switch 42 and a coated wire 43 to the electrode 36a. The wafer W can be absorbed and held on the electrostatic chuck 36 by an electrostatic force caused by a direct current supplied from the direct power source 40.

A refrigerant room or a refrigerant flow path 44 in an annular shape extending in a circumferential direction is formed inside the stage 12. A refrigerant having a predetermined temperature such as a cooling water cw is circulated into and out of and supplied to via pipes 46 and 48 from a chiller unit. It is possible to control the temperature of the wafer W on the electrostatic chuck 36 during the process depending on the temperature of the refrigerant. Related to this, a heat transfer gas from a heat transfer gas supplying unit such as a He gas is supplied between the upper surface of the electrostatic chuck 36 and the back surface of the wafer W. Further, a lift pin vertically penetrating through the stage 12 and movable up and down to load and unload the wafer W, a lifting mechanism for activating the lift pin, and so on are disposed.

Next, various parts related to plasma generation in the inductively-coupled type plasma processing apparatus 5 are described. A circular dielectric window 52 made of, for example, a quartz plate is hermetically attached to the ceiling of the chamber 10 with a relatively large distance from the stage 12. The chamber 10 or the stage 12 and the coil-like RF antenna 54 are horizontally and concentrically arranged on the dielectric window 52. This RF antenna 54 is preferably shaped like a spiral coil or a concentric coil having a constant radius within one turn, and is fixed onto the dielectric window 52 by an antenna fixing member made of an insulating material.

An output terminal of a first high frequency power source 56 is electrically connected to one end of the RF antenna 54 through a matching box 58 and an electric supply line 60. The other end of the RF antenna 54 is electrically connected to a ground potential through an earth cable.

The first high frequency power source 56 may output a high frequency HF for generating plasma having a frequency (for example, 27 MHz or greater) suitable for generation of the plasma by high-frequency discharge. The matching box 58 accommodates a matching circuit of a variable reactance for matching between an impedance on a side of the first high frequency power source 56 and an impedance on a side of a load (mainly, an RF antenna, plasma, and a correction coil).

A gas supply unit for supplying a predetermined gas into the processing space inside the chamber includes an annular manifold or a buffer 62 disposed inside (or outside) a sidewall of the chamber 10 at a position slightly lower than the dielectric window 52, multiple gas discharge ports 64 facing a plasma generation space S from the buffer 62 at equal intervals in the circumferential direction, and a gas supply pipe 68 extending from the gas supply source 66 to the buffer 62. The gas supply source 66 includes a flow rate controller and an on-off valve.

For example, the control unit 74 includes a microcomputer and controls various portions of the inductively-coupled type plasma processing apparatus 5. The various portions of the inductively-coupled type plasma processing apparatus 5 are an evacuation device 26, a second high frequency power source 30, the first high frequency power source, the matching box 32, the matching box 58, the switch for the electrostatic chuck, the gas supply source 66, a chiller unit, and the heat-transfer gas supplying unit.

The film deposition using the inductively-coupled type plasma processing apparatus 5 is performed as follows. At first, the gate valve 28 is opened, the wafer W to be processed is carried into the chamber 10 and is mounted on the electrostatic chuck 36. After the gate valve 28 is closed, a predetermined gas is introduced into the chamber 10 at a predetermined flow rate and a predetermined flow ratio, and the pressure inside the chamber 10 is set to be a set value by the evacuation device 26. Further, the first high frequency power source 56 is turned on to cause the high frequency HF for the plasma generation having predetermined RF power to be output to supply the electric power of the high frequency HF to the RF antenna 54 through the matching box 58 and the electric supply line 60.

On the other hand, in a case where power of high frequency LF for an ion drawing-in control is applied, the second high frequency power source 30 is turned on to cause the high frequency power LF to be output and the power of the high frequency LF to be applied to the stage 12 through the matching box 32 and the feed rod 34. In a case where the power of high frequency LF for the ion drawing-in control is not applied, the power of the high frequency is set to be 0 W. The heat-transfer gas is supplied to a contact interface between the electrostatic chuck 36 and the wafer W from the heat-transfer gas supplying unit, and the switch 42 is turned on to confine the heat-transfer gas to the contact interface by the electrostatic adsorption power of the electrostatic chuck 36.

The predetermined gas discharged from the gas discharge ports 64 in the sidewall uniformly diffuses into the processing space below the dielectric window 52. An RF magnetic field is generated around the RF antenna 54 by an electric current of the high frequency HF flowing through the RF antenna. The magnetic field lines of this RF magnetic field penetrates the dielectric window 52 and pass through the plasma generation space S. A temporal change of the RF magnetic field causes a RF induction field to be generated in an azimuth angle direction of the processing space. Then, electrons accelerated in the azimuth angle direction by this RF induction field are subjected to ionizing collisions with molecules and atoms of the supplied gas so as to generate plasma in a doughnut shape. Radicals and ions of the plasma in the donuts-like shape are dispersed all around in a wide processing space. The radicals fall in an equal direction so as to be supplied on the upper surface (the surface to be processed) of the wafer W. The ions are drawn by a DC bias so as to be supplied on the upper surface (the surface to be processed) of the wafer W. Thus, the active species of the plasma effect chemical reaction and a physical reaction in the surface to be processed of the wafer W. Resultantly, the film to be processed is etched to have a predetermined pattern.

This inductively-coupled type plasma processing apparatus 5 generates the plasma of the inductive coupling to be in the donuts-like shape under the dielectric window 52 close to the RF antenna 54. This plasma in the donuts-like shape is dispersed inside a wide processing space so as to equalize the density of the plasma in the vicinity of the stage 12 (namely, on the wafer W). Here, the density of the plasma in the donuts-like shape depends on the intensity of the RF induction field and further depends on the magnitude of the power of the high frequency HF (specifically, the electric current flowing through the RF antenna 54) supplied to the RF antenna 54. Said differently, as the power of the high frequency HF becomes high, the density of the plasma in the donuts-like shape becomes high. The density of the plasma in the vicinity of the stage 12 becomes totally high due to the diffusion of the plasma. Meanwhile, a mode that the plasma in the donuts-like shape diffuses all around (especially, in a radial direction) depends on the pressure inside the chamber 10. As the pressure becomes lower, the plasma gathers more in the center part of the chamber and a plasma density distribution near the stage 12 tends to increase in the center part. Further, the plasma density distribution inside the plasma in the donuts-like shape may change depending on the power of the high frequency HF supplied to the RF antenna 54, the flow rate of the process gas introduced inside the chamber, or the like.

The plasma in the donuts-like shape is not limited to an exact ring-like shape, in which the plasma rises only on an outer side without rising on an inner side in the radial direction (the center portion) of the chamber 10. In the plasma in the donuts-like shape, the cubic volume or the density of the plasma is greater on the outer side in the radial direction of the chamber 10 than on the inner side in the radial direction of the chamber 10. There may be a case where the plasma in the donuts-like shape is not generated depending on conditions such as the type of the gas used as the process gas and the value of the pressure inside the chamber 10.

The control unit 74 includes a CPU, a read only memory (ROM), and a random access memory (RAM). A procedure set in a recipe stored in the RAM or the like is to control various portions of the inductively-coupled type plasma processing apparatus 5 of this embodiment. Thus, the film deposition method of this embodiment can be controlled.

[Generation of Void]

In recent years, dimensions of semiconductor devices become minute, and holes and grooves in a line and space (L/S) have a high aspect ratio (A/R). As the aspect ratio becomes higher, it becomes more difficult to embed the recess part of the film 8 to be etched with a predetermined film as illustrated in (a) of FIG. 2. Said differently, as illustrated in (b) of FIG. 2, a deposited material R is deposited in an opening of the top of the recess part. As illustrated in (c) of FIG. 2, the opening is closed by the deposited material R to generate a space so-called "void V". Thus, it becomes difficult to completely fill the recess part with the film.

Therefore, in the film deposition method performed by the inductively-coupled type plasma processing apparatus 5 of this embodiment and the film deposition method performed by the inductively-coupled type plasma processing apparatus 5, film forming conditions are made appropriate using multiple test results. Thus, the opening of the top of the recess part having a high aspect ratio is not closed and the inside of the opening may be completely filled with a predetermined film.

[Sample]

Figure 3A:
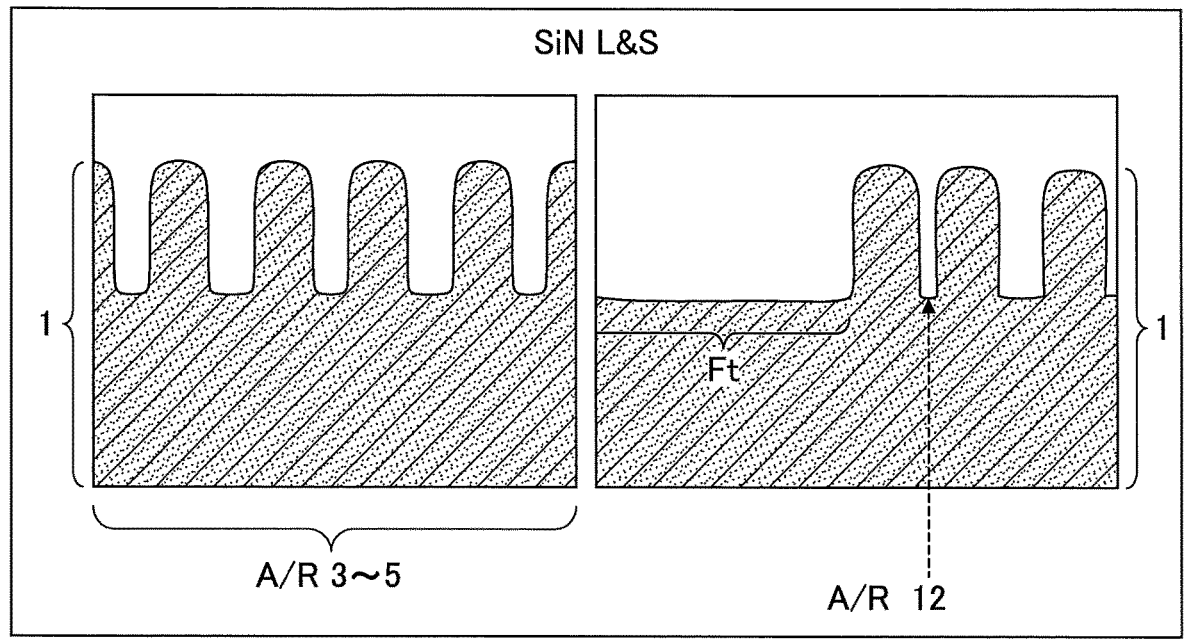
FIGS. 3A-3C illustrate examples of samples of an object to be processed according to the present invention.
Figure 3B:
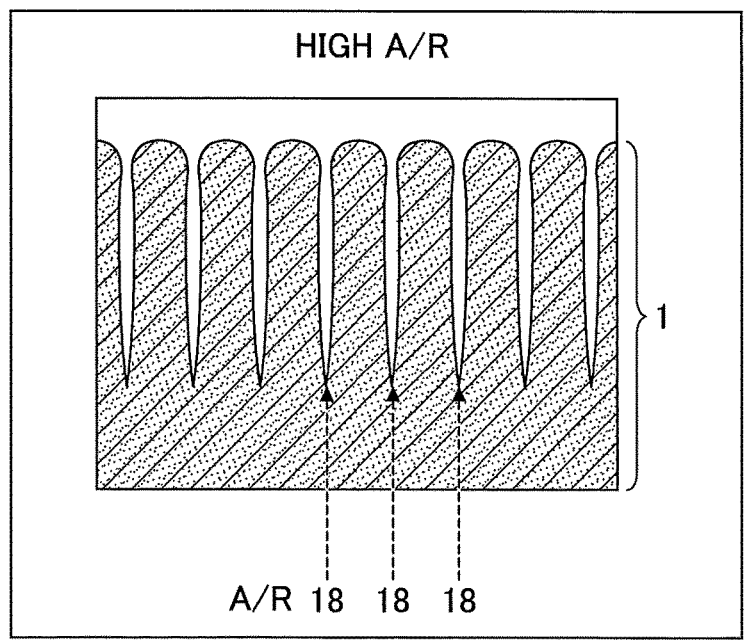
Figure 3C:
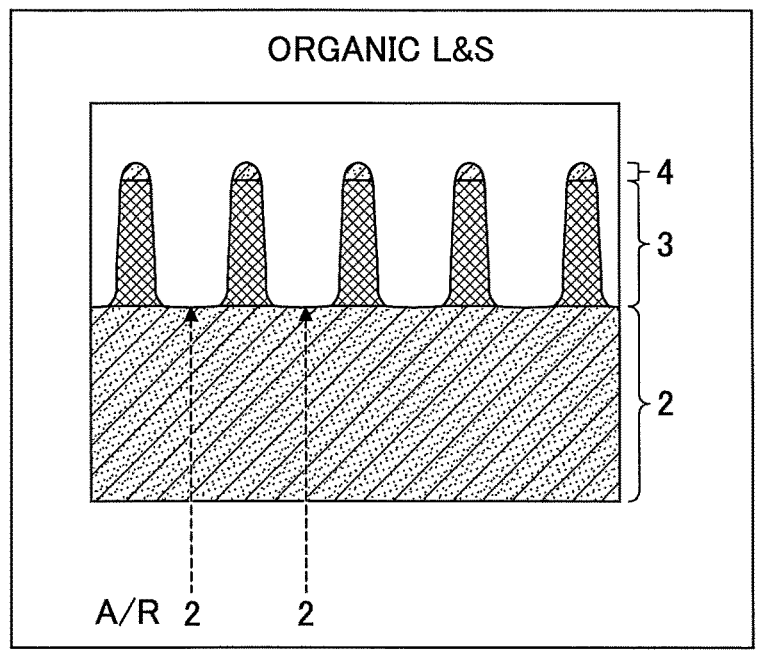

FIGS. 3A to 3C illustrate a sample example of the object to be processed used to perform the film deposition method according to this embodiment. FIG. 3A illustrates a sample of (a) "SiN L&S", in which an SiN film 1 sparsely and densely patterned is formed on the wafer W. The aspect ratio of the recess part patterned on the SiN film 1 is not constant. The recess includes a recess part having an aspect ratio of 3 to 5, a recess part having an aspect ratio of 12, a recess part having an aspect ratio of the other values, and a flat part Ft.

FIG. 3B illustrates a sample of (b) "High A/R", in which an SiN film 1 including a recess part having an aspect ratio of 18 is formed on the wafer W. FIG. 3C illustrates a sample of (c) "Organic L&S", in which a line and space having an aspect ratio of 2 is formed. In the sample of (c) "Organic L&S", a base film is an $SiO_2$ film 2. An organic film 3 and Si-Anti Reflective Coating (an antireflection film; Si-ARC) 4 are laminated on the base film. The aspect ratio of the recess part formed on the sample of "Organic L&S" is 2. Therefore, in the film deposition method of this embodiment, the film is formed on the recess parts of the samples whose aspect ratio is two or greater.

[Test 1: Film Deposition]

Figure 4A:
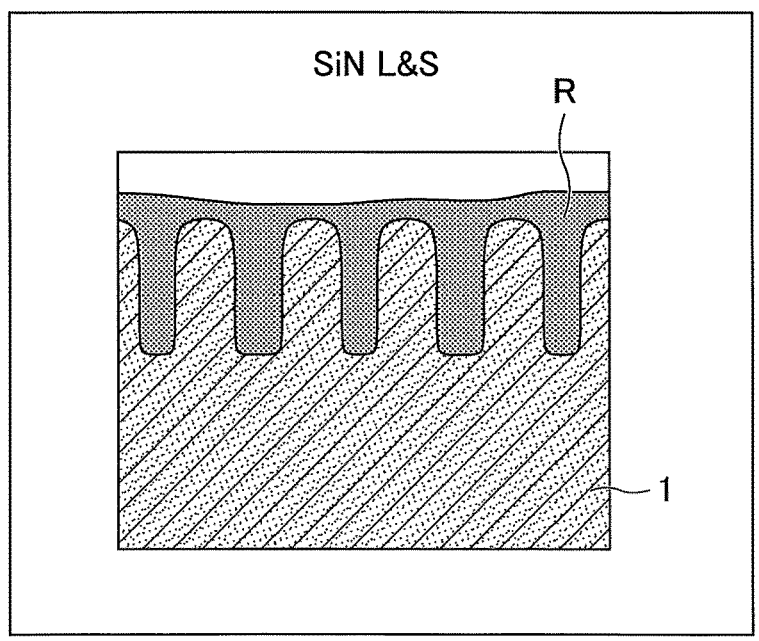
FIGS. 4A-4C illustrate examples of test results of a film deposition method according to the present invention.
Figure 4B:
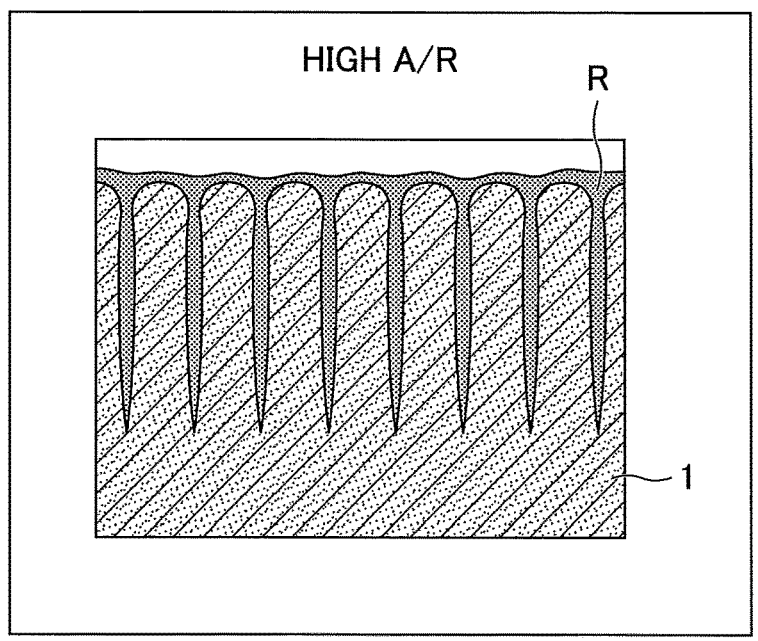
Figure 4C:
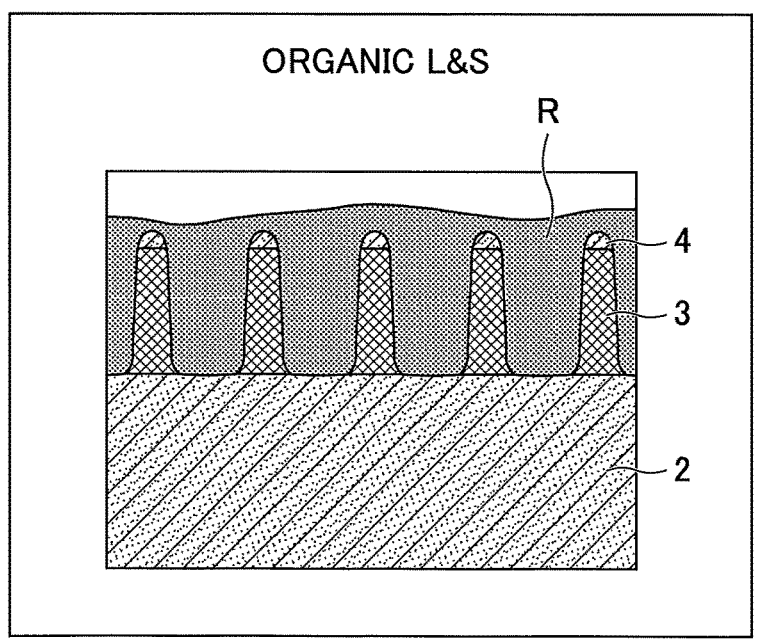

Next, referring to FIGS. 4A-4C, a result of a test 1 of the film deposition method performed by the inductively-coupled type plasma processing apparatus 5 according to this embodiment is described. A film deposition condition 1 of the test 1 is as follows.

(Film Deposition Condition 1)
<}0{><0} Chamber internal pressure: 100 mT (13.3 Pa)
Gaseous species: $C_4F_6$ 300 sccm
Stage temperature: −50° C.
Film deposition time: 5 sec
Power of high frequency HF: 300 W
Power of high frequency LF: 0 W According to the result of the test, in every sample of (a) "SiN L&S", (b) "High A/R", and (c) "Organic L&S", a precursor inside plasma generated from a $C_4F_6$ gas is deposited on the recess part so as to be deposited upward from the bottom. Therefore, no void is generated. Hereinafter, a film (the deposited material R) deposited by the film deposition method of this embodiment is referred to as a "flowable organic film R". According to the test 1, not only in the case of the SiN film illustrated in FIGS. 4A and 4B but also in the case of the organic film 3 illustrated in FIG. 4C, the recess part may be embedded with the flowable organic film R.

[Test 2: Time Change of Film]

Next, FIGS. 5A-5E illustrate an example of a film change in response to the film deposition time of the flowable organic film R using a sample of "SiN L&S". A film deposition condition 2 of the test 2 is as follows.

Figure 5A:
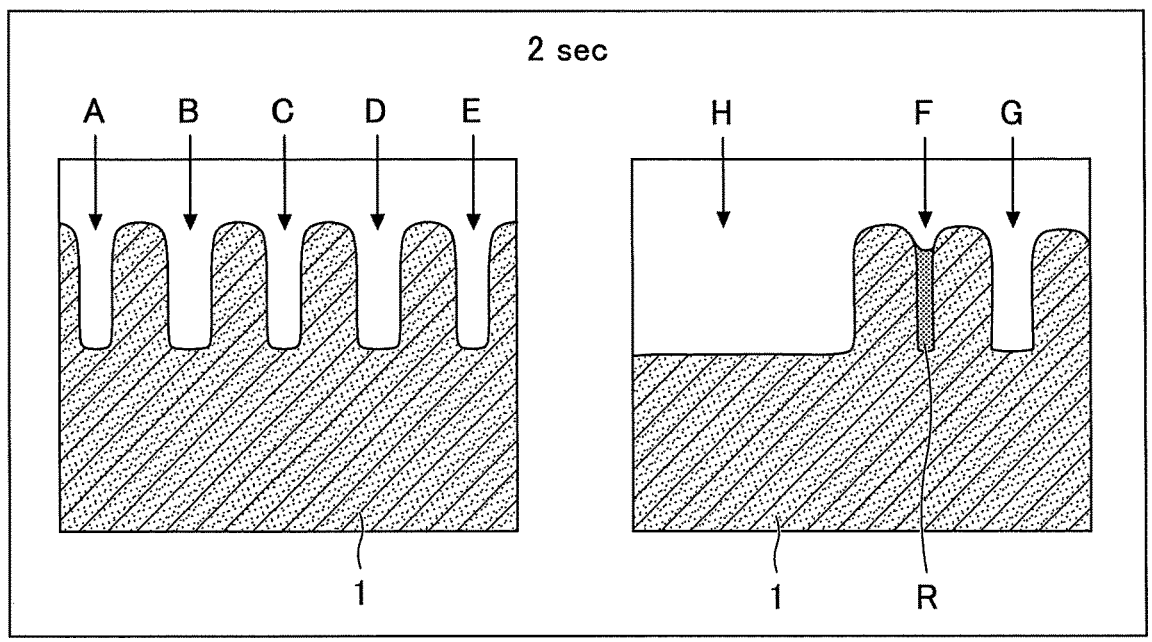
FIGS. 5A-5E illustrate examples of test results of time changes of a film by a film deposition method according to the present invention.

(Film Deposition Condition 2)
Chamber internal pressure: 50 mT (6.65 Pa)
Gaseous species: $C_4F_6$ 300 sccm
Stage temperature: −50° C.
Power of high frequency HF: 300 W
Power of high frequency LF: 0 W FIG. 5A illustrates a state of the film deposition, in which the film deposition time is 2 sec. In the lower half of FIG. 5A, a recess part F whose aspect ratio is 12 is completely filled with the flowable organic film R.

Figure 5B:
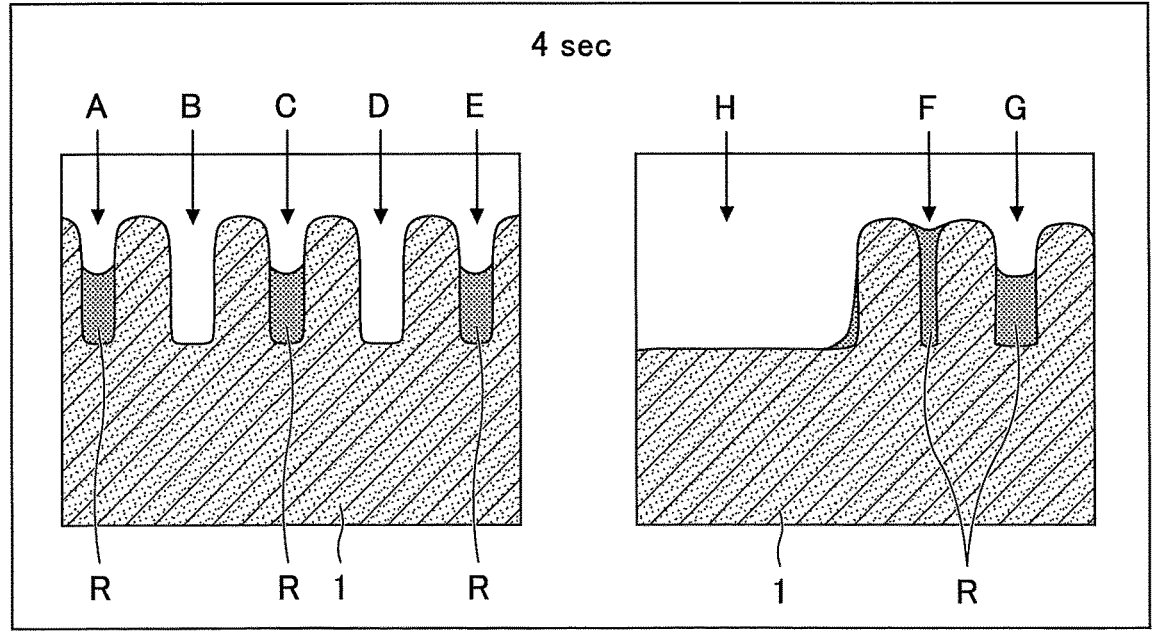

FIG. 5B illustrates a state of the flowable organic film R at a film deposition time of 4 seconds. Referring to FIG. 5B, the flowable organic film R is not deposited on the recess parts B and D. The flowable organic film R is deposited more on the holes of the recess parts A, C, and E than on the recess parts B and D. It is known that the flowable organic film R is deposited on the recess part G. At this time, the flowable organic film R is scarcely deposited on the flat part H.

Figure 5C:
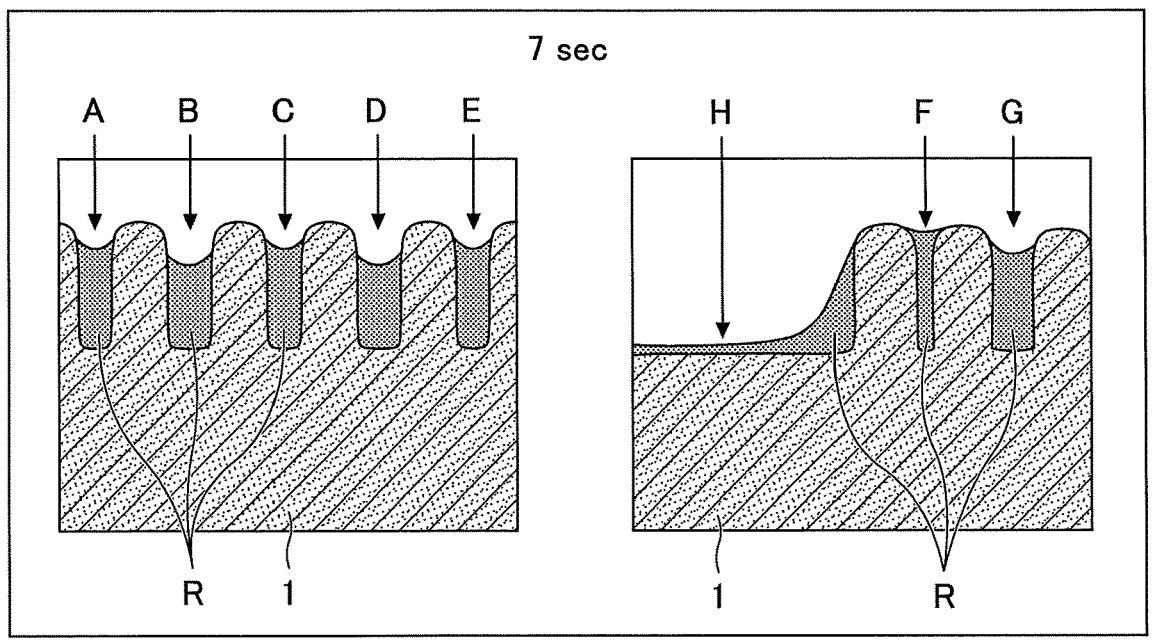
Figure 5D:
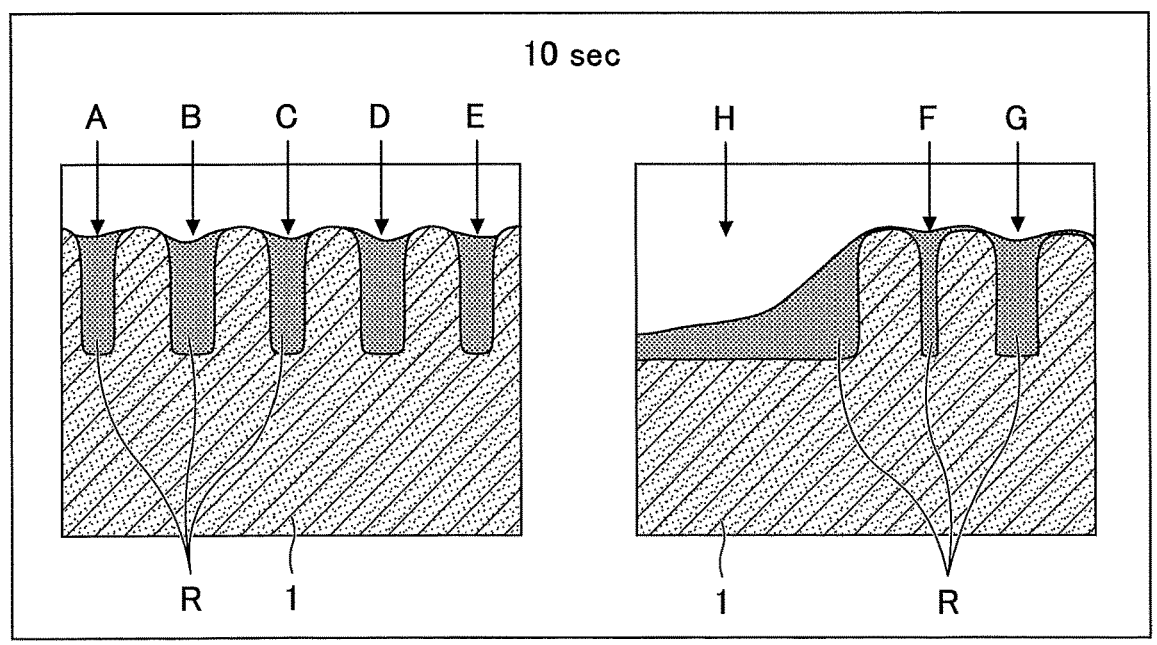
Figure 5E:
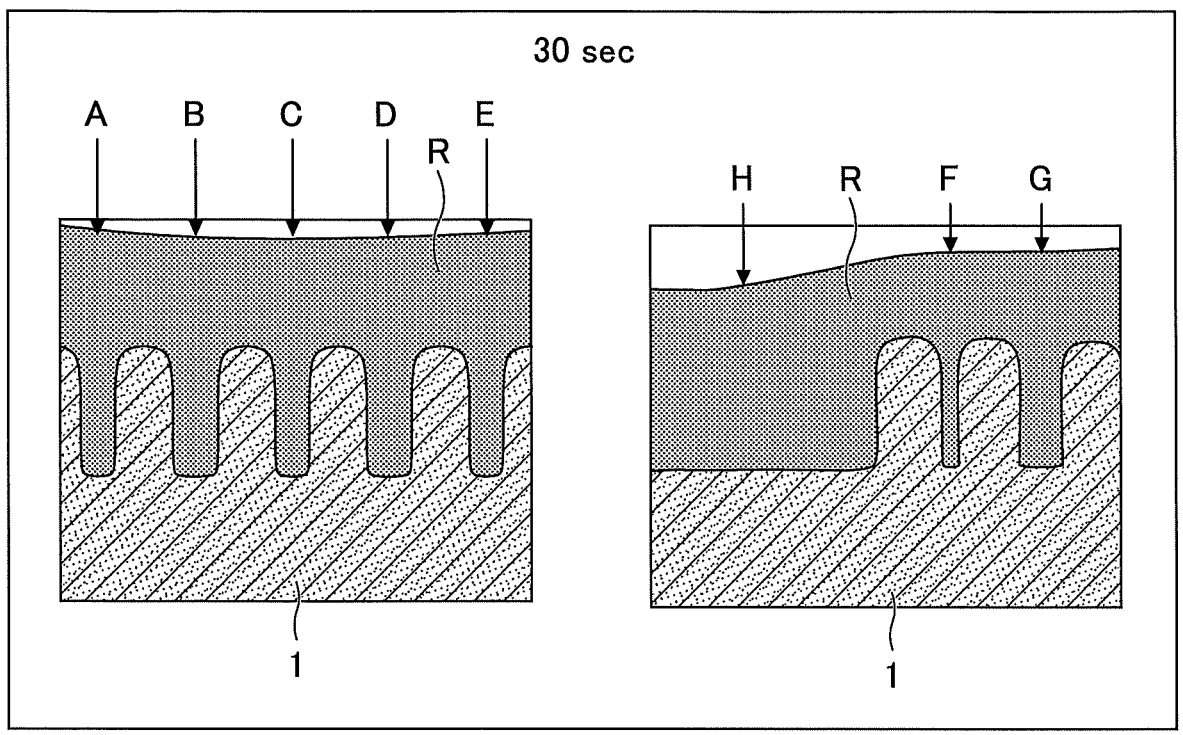

FIG. 5C illustrates a state of the flowable organic film R at a film deposition time of 7 seconds. FIG. 5C illustrates deposition of the flowable organic film R in the flat part H. FIG. 5D illustrates a state of the flowable organic film R at a film deposition time of 10 seconds. Referring to FIG. 5D, the recess parts A to G are almost filled with the flowable organic film, and more flowable organic film R is deposited on the flat part H. FIG. 5E illustrates a state of the flowable organic film R at a film deposition time of 30 seconds. In FIG. 5E, all recess parts and flat parts H are completely filled with the flowable organic film R.

As described above, in the film deposition method of this embodiment, the recess part is filled with the flowable organic film R by depositing the precursor in the plasma generated from the $C_4F_6$ gas. At this time, the flowable organic film R upward grows from the bottom part of the recess part and sequentially deposited from bottom up. In the film deposition method of this embodiment, a deposited material is hardly deposited in the opening of the top of the SN film 1. Therefore, it is possible to fill the inside of the recess part with the flowable organic film R.

Within the film deposition method of this embodiment, the flowable organic film R firstly fills a hole having the width whose recess part is narrow. As illustrated in FIGS. 5A-5E, when the film deposition time is short, the flowable organic film R sequentially fills the hole having a narrower recess part. Therefore, uniformity is not good such that there is a hole completely filled with the flowable organic film R and another hole incompletely filled with the flowable organic film R. However, if the film deposition time is prolonged, the flowable organic film R also fills a hole having a wide recess part. At around the film deposition time of 30 seconds, all the holes are completely filled with the flowable organic film R.

As the aspect ratio of the recess part becomes higher, the film deposition speed becomes faster. Further, it is known that the film deposition speed in the recess parts A to G of the wafer W is faster than the film deposition speed in the flat part H of the wafer W.

Figure 6A:
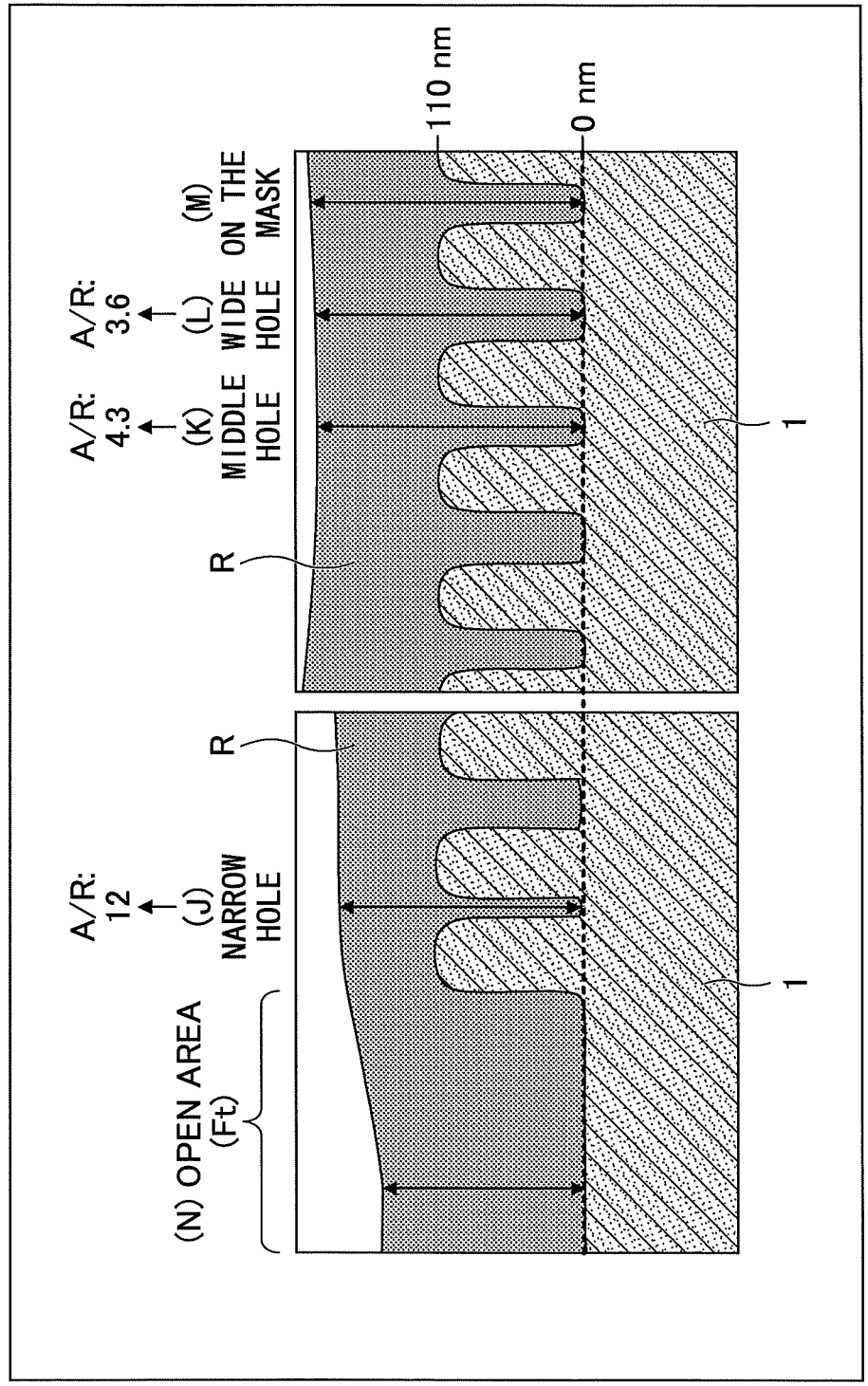
FIGS. 6A-6B illustrate examples of test results of time changes of a film by a film deposition method according to the present invention.
Figure 6B:
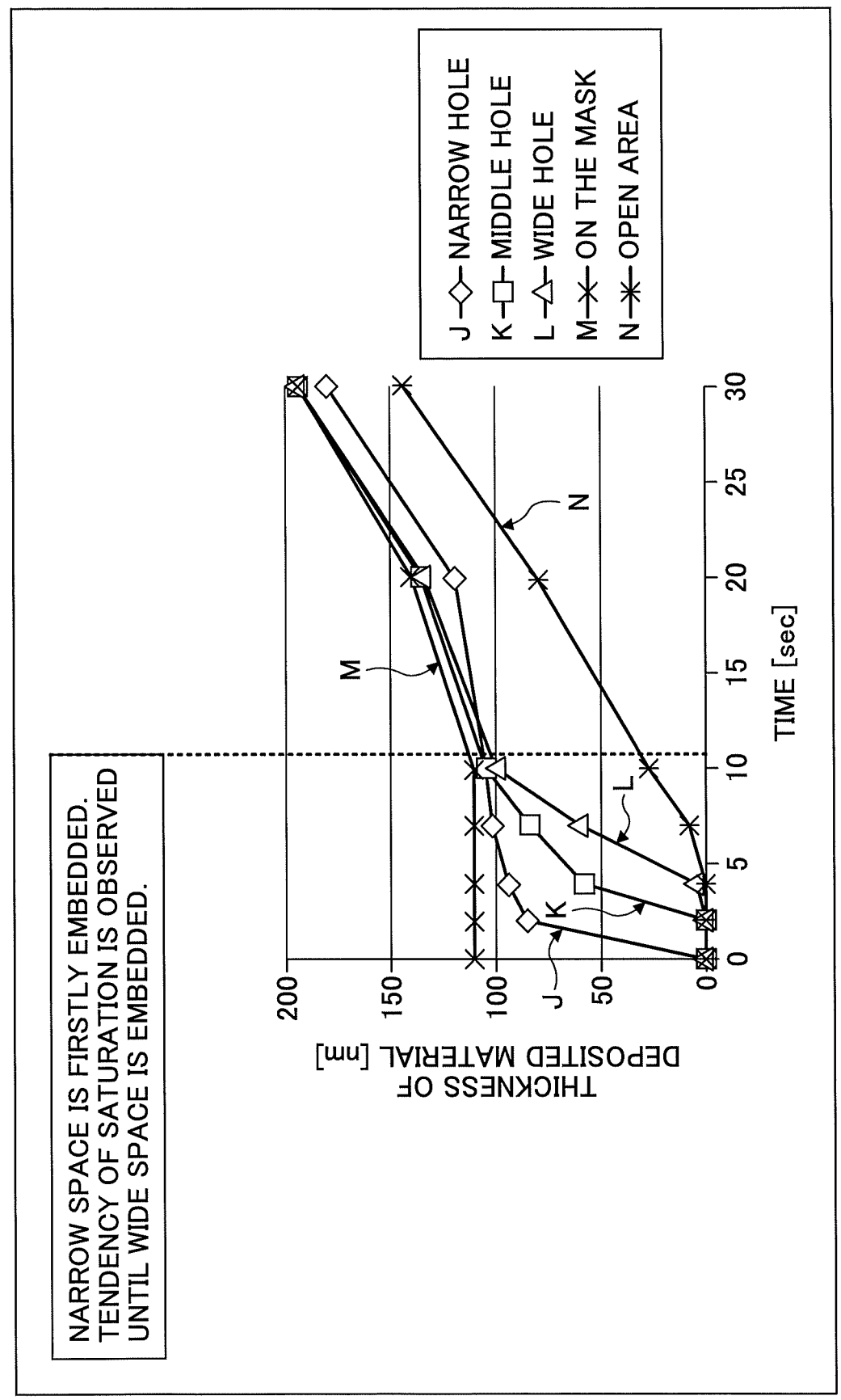

FIG. 6B is a graph illustrating test results in FIGS. 5A to 5D. The horizontal axis represents the film deposition time (sec), and the vertical axis represents the thickness (nm) of the deposited material. A curve line J represents a time change of the film thickness of the narrow hole having an aspect ratio of 12. A curve line K represents a time change of the film thickness of a middle hole whose aspect ratio is 4.3. A curve line L represents a time change of the film thickness of a wide hole whose aspect ratio is 3.6. A curve line M represents a time change of the film thickness of a deposited material depositing on the top of the SiN film functioning as a mask. A curve line N represents a time change of the film thickness of the deposited material depositing on a flat part (i.e., an open area).

As illustrated in a cross-sectional view of FIG. 6A, the height of the bottom part of the SiN film 1, and the height of the top of the SiN film 1 is 110 nm. The deposited material is not deposited on the top of the SiN film 1 in a time band range while the curve line M designates a thickness of 110 nm. The curve lines rise in an order of the curve line J, the curve line K, and the curve line L. Said differently, the flowable organic film R fills the inside of the narrow hole represented by the curve line J, the inside of the middle hole of the curve line K, and the inside of the wide hole of the curve line L in this order.

Further, with reference to the thickness of the deposited material of the top (on a mask) represented by the curve line M, after the narrow hole, the middle hole, and the wide hole are filled, the flowable organic film R deposits in the top of the SiN film. The flowable organic film R starts to be deposited on the flat part represented by the curve line N at a time of 10 seconds faster than the film deposition time when all of the narrow hole, the middle hole, and the wide hole are filled with the flowable organic film R. However, the film deposition speed of the flat part is substantially equal to the film deposition speed in the top of the SiN film 1.

[Test 3: Temperature Dependence]

Next, referring to FIG. 7, the temperature dependence of the film by the film deposition method is described. FIG. 7 illustrates an example of a result of the temperature dependence of the film by the film deposition method according to this embodiment using a sample of "SiN L&S". A film deposition condition 3 of a test 3 is as follows.

(Film Deposition Condition 3)
Chamber internal pressure: 50 mT (6.65 Pa) or 100 mT (13.3 Pa)
Gaseous species: $C_4F_6$: 125 sccm or 300 sccm; and isopropyl alcohol (IPA) $C_3H_8O$: 75 sccm
Stage temperature: −10° C., −20° C., −30° C., −40° C., −50° C.
Power of high frequency HF: 300 W
Power of high frequency LF: 0 W Specifically, (a) of FIG. 7 illustrates a state of the film at various temperature when the inside of the chamber is maintained to have the pressure of 100 mT, and the $C_4F_6$ gas of 300 sccm is supplied. According to this, voids V are generated at −10° C. and −20° C., the film deposition from bottom up is not performed, and an isotropic film deposition as illustrated in FIG. 2 is performed. On the other hand, at −30° C. and −50° C., the film deposition from bottom up is performed so as to pile the film from the bottom part of the recess part. Therefore, the voids V are not generated, and the inside of the recess part is completely filled with the flowable organic film R.

Referring to (b) of FIG. 7, illustrated is a state of the film at various temperature when the inside of the chamber is maintained to have the pressure of 50 mT, and an isopropyl alcohol (IPA) gas of 75 sccm is supplied. IPA is one kind of secondary alcohol. Accordingly, the voids V are generated at −10° C. and −30° C., and the isotropic film deposition is performed. On the other hand, at −40° C. and −50° C., the voids V are not generated, and the recess part is completely filled with the flowable organic film R. However, the result at −40° C. is not obtained.

Referring to (c) of FIG. 7, illustrated is a state of the film at various temperature when the inside of the chamber is maintained to have the pressure of 50 mT, and the $C_4F_6$ gas of 300 sccm is supplied. Accordingly, the voids V are generated at −10° C., and the isotropic film deposition is performed. On the other hand, at −20° C., −30° C., and −50° C., the voids V are not generated, and the recess part is completely filled with the flowable organic film R. However, the result at −40° C. is not obtained.

Referring to (d) of FIG. 7, illustrated is a state of the film at various temperature when the inside of the chamber is maintained to have the pressure of 50 mT, and the $C_4F_6$ gas of 125 sccm is supplied. Accordingly, the voids V are generated at −10° C. and −20° C., and the isotropic film deposition is performed. On the other hand, at −30° C., the voids V are not generated, and the recess part is completely filled with the flowable organic film R. However, the results at −40° C. and −50° C. are not obtained.

As described above, a temperature enabling the recess part to completely fill with the flowable organic film R differs depending on the gaseous specie, the pressure, and the gas flow rate. In a case where the pressure of the inside of the chamber is maintained to be 50 mT and the $C_4F_6$ gas is supplied at 300 sccm under an ultralow temperature of −20° C. in the stage, the recess part can be completely filled with the flowable organic film R.

[Test 4: Pressure Dependence]

Figure 8:
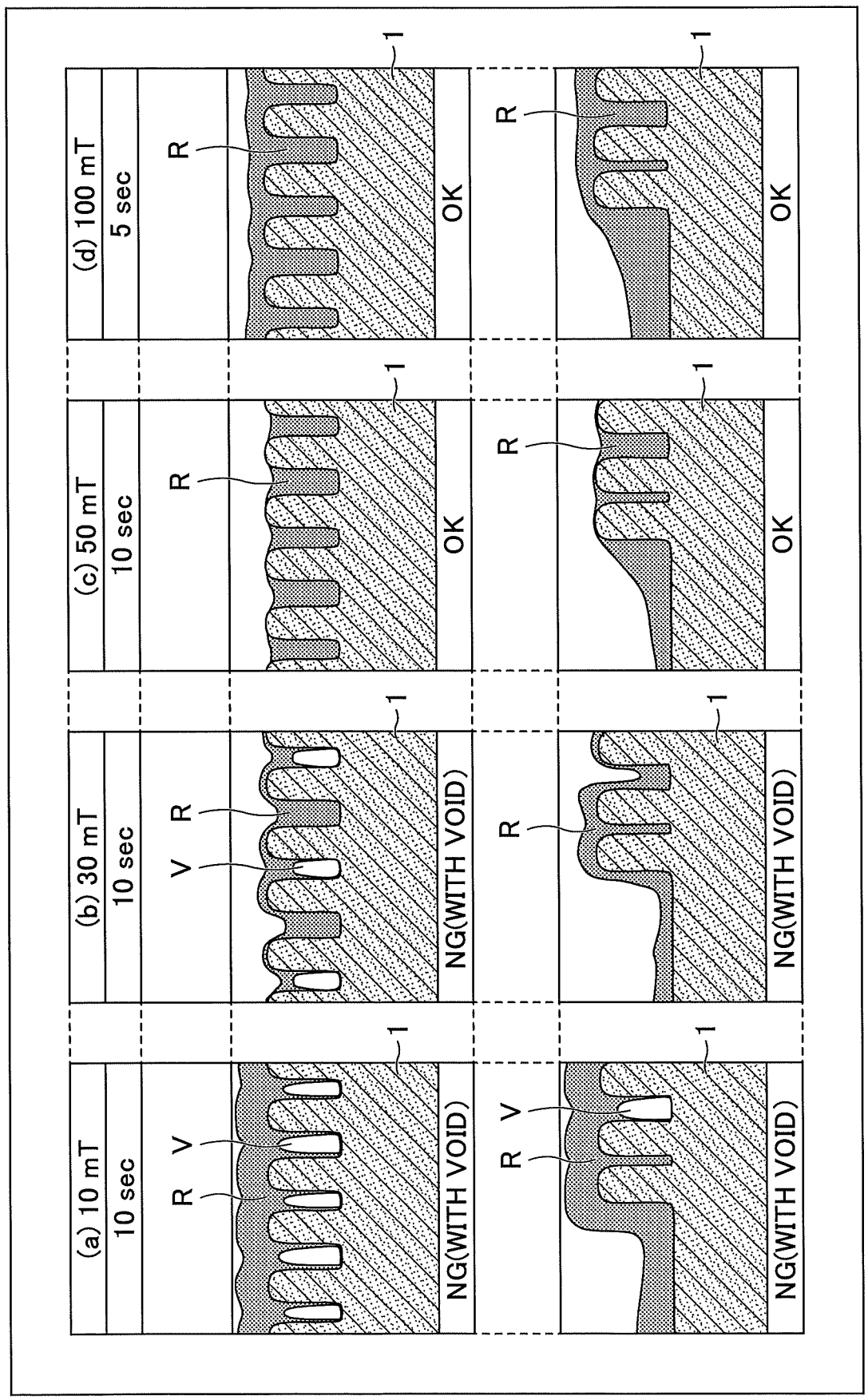
FIG. 8 illustrates examples of test results of pressure dependence of a film by a film deposition method according to the present invention.

Next, referring to FIG. 8, the pressure dependence of the film by the film deposition method of this embodiment is described. FIG. 8 illustrates an example of a result of the pressure dependence of the film by the film deposition method according to this embodiment using a sample of "SiN L&S". A film deposition condition 4 of a test 4 is as follows.

(Film Deposition Condition 4)
Chamber internal pressure: 10 mT (1.33 Pa), 30 mT (4.00 Pa), 50 mT, or 100 mT
Gaseous species: $C_4F_6$
Gas flow rate: 300 sccm
Stage temperature: −50° C.
Power of high frequency HF: 300 W
Power of high frequency LF: 0 W According to the result of this test, when the $C_4F_6$ gas is supplied in a state where the stage 12 is maintained at an ultralow temperature of −50° C., as illustrated in (a) and (b) of FIG. 8, the voids are generated when the film deposition time is 10 sec and the chamber internal pressure is 10 mT or 30 mT. Meanwhile, referring to (c) and (b) of FIG. 8 with a change only in the condition of the pressure, the voids are not generated, and the recess part is filled a when the film deposition time is 10 sec and the chamber internal pressure is 50 mT and when the film deposition time is 5 sec and the chamber internal pressure is 100 mT. Therefore, in a case where the stage 12 is maintained to be an ultralow temperature of −50° C. or lower and the $C_4F_6$ gas is supplied, the chamber internal pressure is set to be 50 mT or higher to perform the film deposition from bottom up. Thus, the recess part is completely filled with the flowable organic film R.

[Test 5: Gas Dependence]

Next, referring to FIG. 9, the gas dependence of the film by the film deposition method of this embodiment is described. FIG. 9 illustrates an example of a result of the temperature dependence of the film by the film deposition method according to this embodiment using a sample of "SiN L&S". A film deposition condition 5 of the test 5 is as follows.

(Film Deposition Condition 5)
Chamber internal pressure: 50 mT ($C_4F_6$, IPA, $CH_4$, $C_4F_8$), 100 mT ($C_4F_6$, IPA, $CH_4$, $C_4F_8$)
Gaseous species: $C_4F_6$, IPA($C_3H_8O$), $CH_4$, $CH_3F$, $CF_4$, $C_4F_8$)
Stage temperature: −50° C., −40° C., −30° C., −20° C., −10° C.
Power of high frequency HF: 300 W
Power of high frequency LF: 0 W According to a result of this test, the void V is not generated using a $C_4F_6$ gas, an IPA($C_3H_8O$) gas, and a $C_4F_8$ gas. The recess part is completely filled with a flowable organic film R. When $C_4F_6$ gas is used, it is possible to deposit the flowable organic film R deposited from the bottom part of the recess part (from bottom up) by making the temperature of the stage −20° C. or less. When an IPA ($C_3H_8O$) gas is used, by making the temperature of the stage −40° C. or less, it is possible to deposit a flowable organic film R from bottom up. When a $C_4H_8$ gas is used, by making the temperature of the stage −30° C. or less, it is possible to deposit the flowable organic film R from bottom up.

On the other hand, the void V is generated in the $CH_4$ gas and the $CH_3F$ gas. Therefore, it is impossible to completely fill the recess part with the flowable organic film R. When the $CH_4$ gas or the $CH_3F$ gas is used, even though the temperature of the stage is made −50° C., the flowable organic film R from bottom up wasn't deposited. When $CF_4$ gas is used, even though the temperature of the stage is made −50° C., the flowable organic film R from bottom up wasn't deposited.

(Low Vapor Pressure Material)

Figure 10:
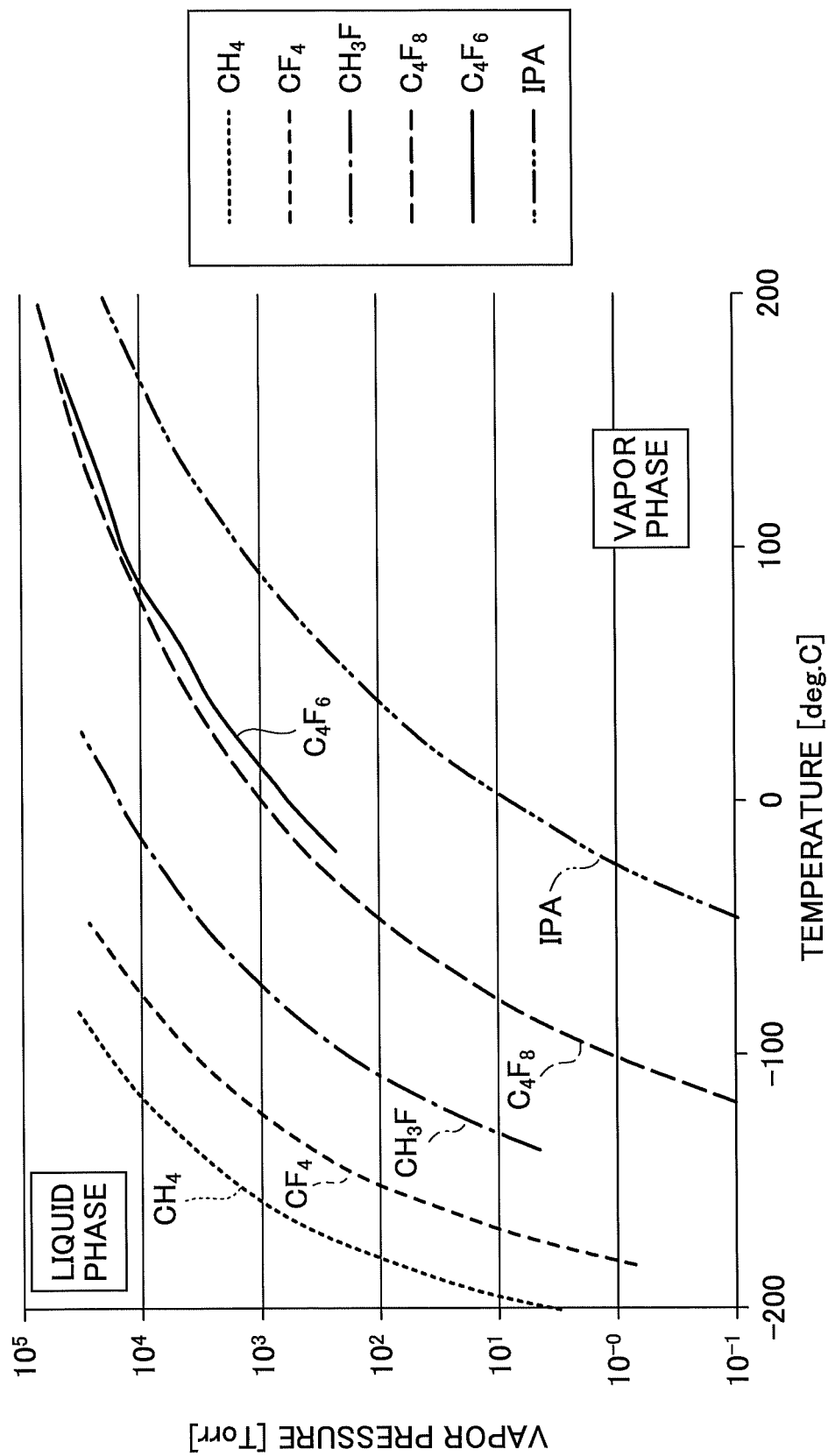
FIG. 10 illustrates examples of vapor pressure curves.

FIG. 10 illustrates vapor pressure curves. The $CH_4$ gas, the $CH_3F$ gas, and the $CF_4$ gas, with which the flowable organic film R deposited from the bottom part of the recess part (from bottom up) was not deposited, have vapor pressures at temperatures lower than the vapor pressure curve of $C_4F_8$. On the contrary, $C_4F_8$, $C_4F_6$, gas, and isopropyl alcohol (IPA), with which the flowable organic film R deposited from the bottom part of the recess part (from bottom up) was successfully deposited, have the vapor pressures at temperatures equal to or greater than the temperature indicated by the vapor pressure curve. Said differently, the low-vapor-pressure material has an equilibrium vapor pressure that is less than or equal to $C_4F_8$ at a given temperature.

From the results of the tests 1 to 5, the film deposition method of this embodiment, the film deposition method according to this embodiment includes a step of installing the wafer W on the stage cooled to have an ultralow temperature of −20° C. in a state where the inside of the chamber 10 is maintained to have a predetermined pressure, and a step of supplying a gas including a gas of the low vapor pressure material into the inside of the chamber 10. Further, the film deposition method includes a step of generating plasma from the gas including the gas of the low vapor pressure material and depositing the film on the wafer W by a precursor generated from the low vapor pressure material using the generated plasma. Therefore, it is possible to deposit the flowable organic film R deposited from the bottom part of the recess part (from bottom up). At this time, the pressure inside the chamber 10 is 50 mT (6.67 Pa) or greater and the vaper pressure or smaller indicated by the vapor pressure curve of the gas of the low vapor pressure material.

Further, the gas of the low vapor pressure material. The carbon-containing gas may be specifically $C_4F_8$, $C_4F_6$, gas, and isopropyl alcohol (IPA). With this, according to the film deposition method of this embodiment, it is possible to laminate the precursor generated from the low vapor pressure material on the bottom part of the recess part formed on the wafer W so as to deposit the flowable organic film on the wafer W.

[Test 6: LF Dependence]

Figure 11:
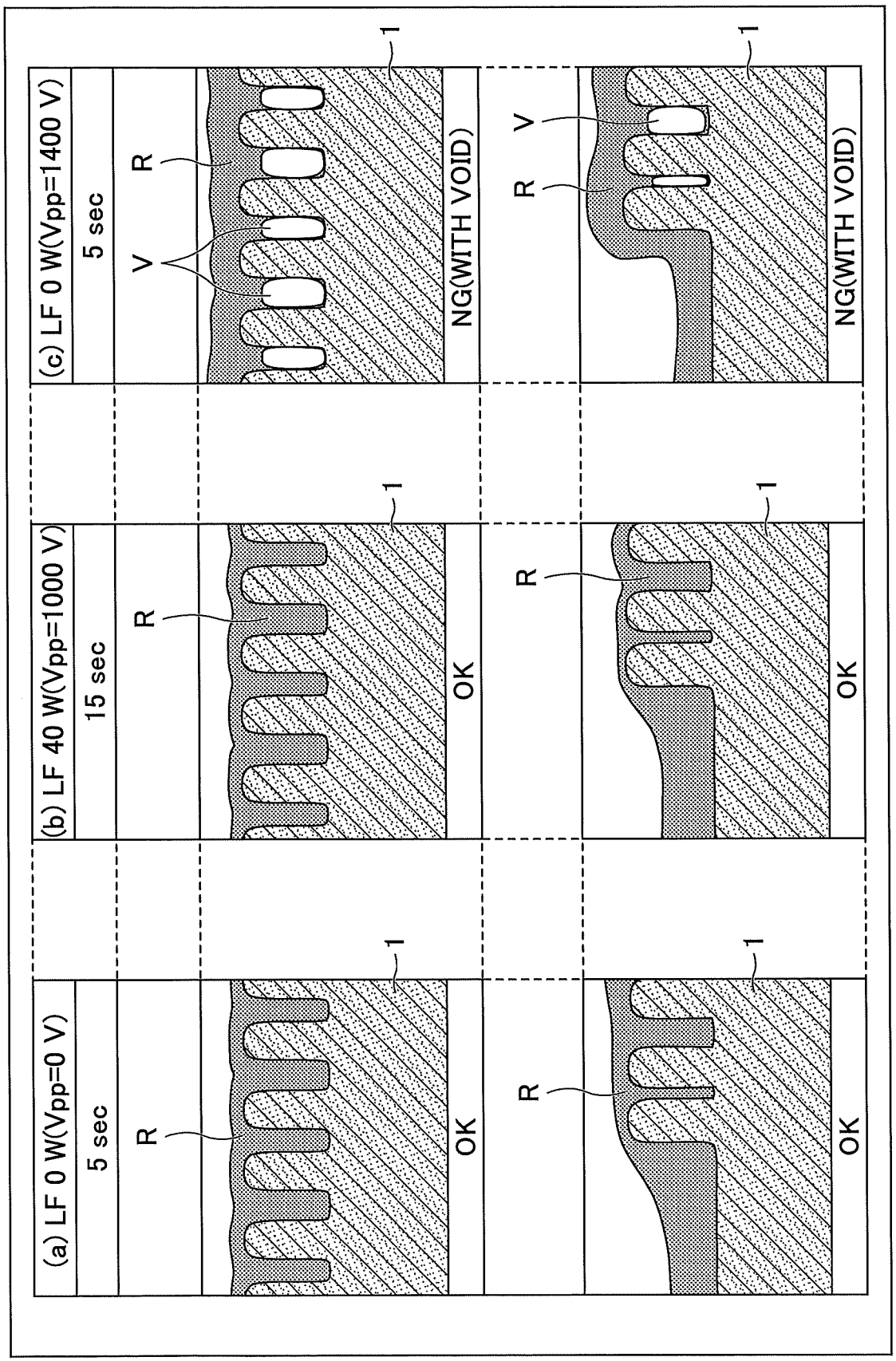
FIG. 11 illustrates examples of test results of LF dependence of a film by a film deposition method according to the present invention.

Next, FIG. 11 illustrates the result of the test 6 indicating a change of the state of the film depending on whether the power of the high frequency LF for pull-in of the bias. FIG. 11 illustrates examples of experimental results of LF dependence of a film by a film deposition method according to this embodiment. A film deposition condition 6 of the test 6 is as follows.

(Film Deposition Condition 6)
Chamber internal pressure: 100 mT
Gaseous species: $C_4F_6$
Stage temperature: −50° C.
Power of high frequency HF: 300 W
Power of high frequency LF (400 kHz): 0 W (Vpp=0 V), 40 W (Vpp=1000 V), 100 W (Vpp=1400 V)

According to the result of the test, in a case where the power of the high frequency LF illustrated in (a) of FIG. 11 is 0 W, the voltage Vpp applied to the stage 12 is 0 V. Said differently, the ion energy is 0 V. At this time, the flowable organic film R is deposited on the recess part from bottom up. Said differently, in a case where the electric power of the high frequency LF is not applied, the recess part can be completely filled with the flowable organic film R.

Next, in a case where the power of the high frequency LF illustrated in (b) of FIG. 11 is 40 W, the voltage Vpp applied to the stage 12 is 1000 V. Said differently, the ion energy is 1000 V. At this time, the flowable organic film R is deposited on the recess part from bottom up.

On the other hand, in a case where the power of the high frequency LF illustrated in (c) of FIG. 11 is 100 W, the voltage Vpp applied to the stage 12 is 1400 V. Said differently, the ion energy is 1400 V. However, the void V is generated, and the flowable organic film R does not completely fill the recess part from bottom up.

As described, according to the film deposition method of this embodiment, the power of the high frequency HF for generating the plasma is applied to the inside 10 of the chamber 10, and the high frequency power for the pull-in of bias to cause the ion energy to become higher than 1000 V. Then, the film is isotropically deposited on the top of the SiN film 1 so as to possibly generate the void V. Therefore, it is preferable to apply the power of the high frequency HF for generating plasma to the inside of the chamber 10, and additionally the power of the high frequency LF for the pull-in of the bias of the high frequency LF is not applied or the power of the high frequency LF for the pull-in of the bias of the high frequency LF causing the ion energy to be 1000 V or lower is applied.

[Test 7: Addition of Diluent Gas]

Figure 12:
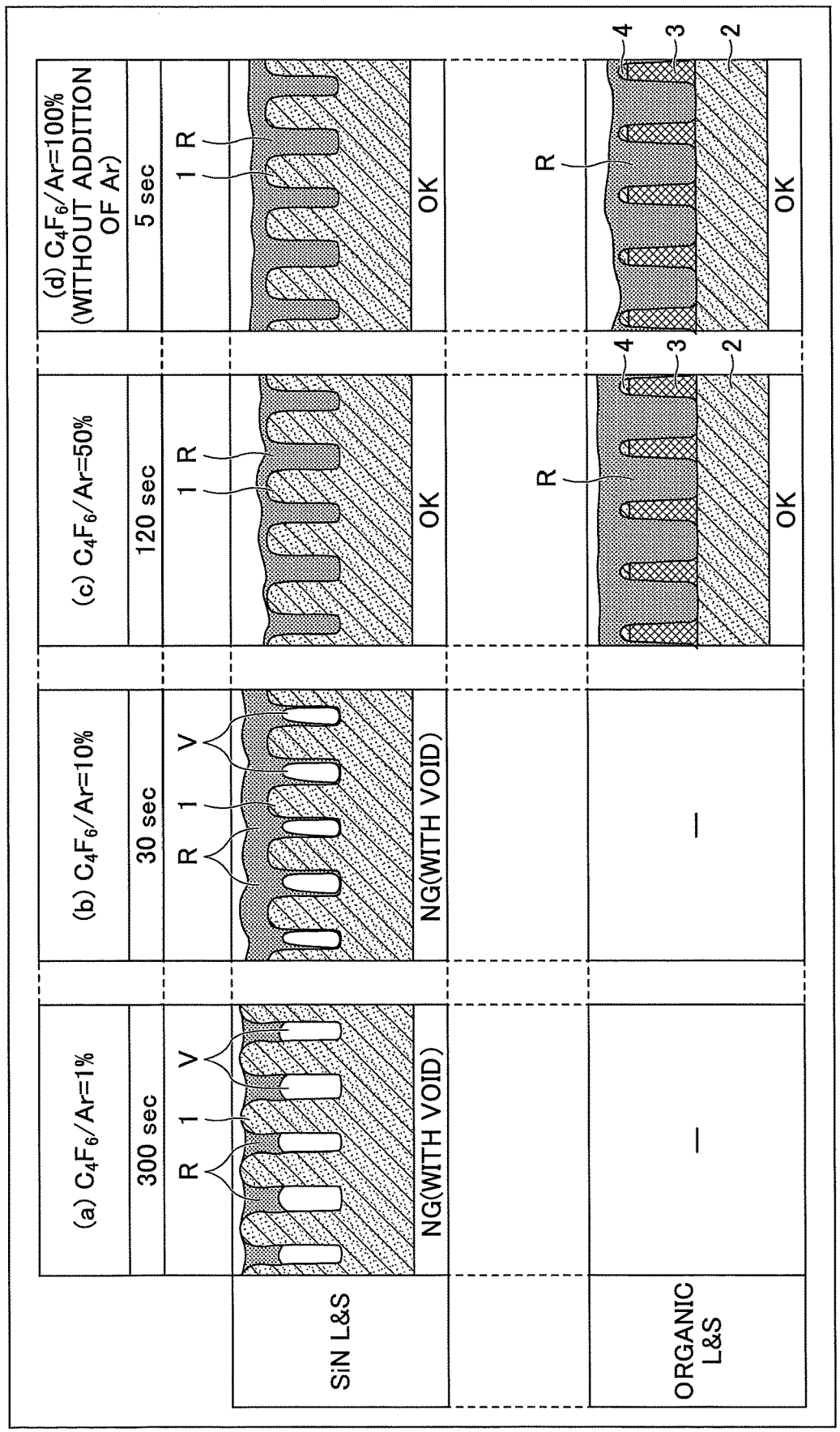
FIG. 12 illustrates examples of test results of dilution caused by an additive gas in a film deposition method according to the present invention.

Referring to FIG. 12, the result of the test 7 of adding a diluent gas to a gas of a low vapor pressure material used in the film deposition method of this embodiment. FIG. 12 illustrates an example of the result of adding an Ar gas as a diluent gas to the gas of the low vapor pressure material used in the film deposition method of this embodiment. The Ar gas is used as a diluent gas in this test. However, the diluent gas is not limited thereto. For example, any one of the Ar gas, the He gas, the Ne gas, and the Xe gas may be added as an inactive gas.

In the test 7 illustrated in FIG. 12, the $C_4F_6$ gas is diluted by the Ar gas, and supplied into the inside of the chamber 10. The dilution degrees of (a) to (d) are 1%, 10%, 50%, and 100%. In a case where the dilution degree is 1%, a ratio of the C4F6 gas relative to the Ar gas is 1%. In a case where the dilution degree is 100%, the ratio of the $C_4F_6$ gas relative to the Ar gas is 100%. In this case, the Ar gas is not included in the gas (here, the $C_4F_6$ gas) of the low vapor pressure material. The deposition time is 300 sec in a case where the dilution degree is 1%. The deposition time is 30 sec in a case where the dilution degree is 10%. The deposition time is 120 sec in a case where the dilution degree is 50%. The deposition time is 5 sec in a case where the dilution degree is 100%. A film deposition condition 7 of the test 7 is as follows.

(Film Deposition Condition 8)
Chamber internal pressure: 100 mT
Gaseous species: $C_4F_6$
Diluent gas: Ar
Stage temperature: −50° C.
Power of high frequency HF: 300 W
Power of high frequency LF: 0 W In this test, a sample of "SiN L&S" and a sample of "Organic L&S" are used. According to this test, in any one of the samples, in the case where the stage temperature is ultralow of −50° C., the top of the mask is blocked so as to generate the void V. Specifically, in a case where the dilution degree is 1% and 10%, an isotropic film deposition is performed so as to generate the void V. On the other hand, in a case where the dilution degree is 50% or 100%, the flowable organic film R is deposited from the bottom part of the recess part (from bottom up) so as not to generate the void. With this, when the dilution degree becomes 50% or less, a rate of the Ar gas increases to enhance an influence due to ions. Therefore, it is known that the film deposition from bottom up cannot be performed.

Accordingly, the gas including the gas of the low vapor pressure material may include an inactive gas, and it is preferable to make the ratio of the gas flow rate of the low vapor pressure material relative to the flow rate of the inactive gas.

[Test 8: Apparatus Dependency]

Figure 13:
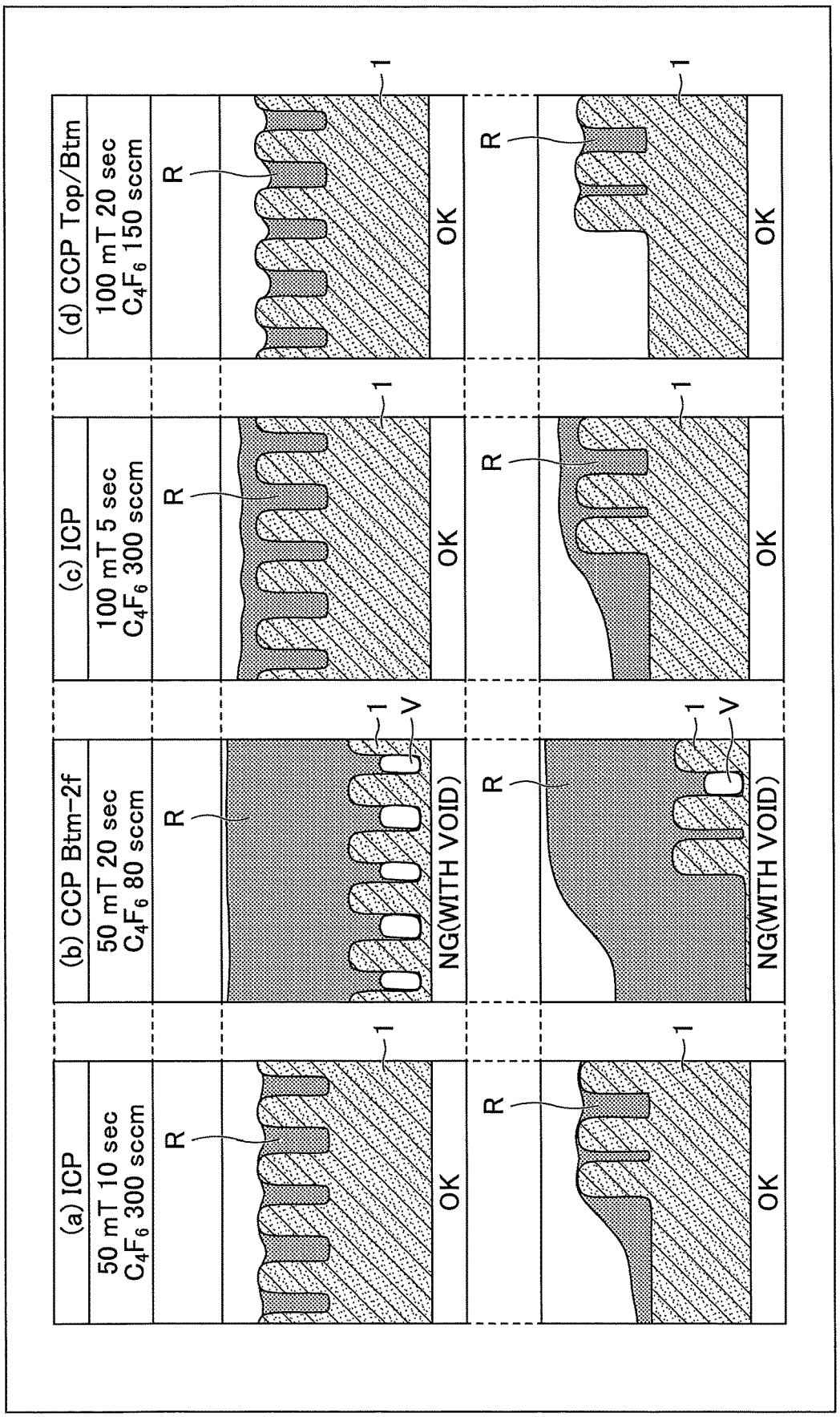
FIG. 13 illustrates examples of test results of apparatus dependence of a film by a film deposition method according to the present invention.
Figure 14A:
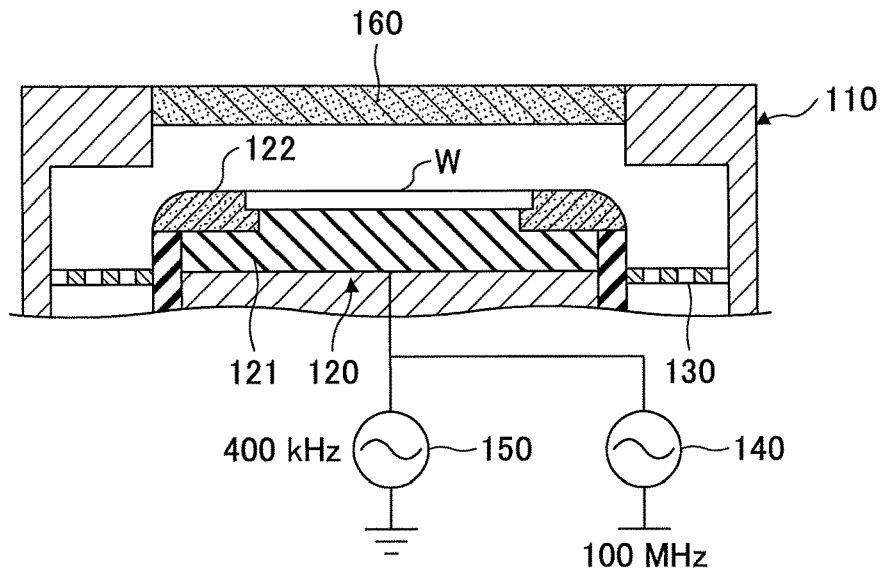
FIGS. 14A-14B illustrate examples of schematic structures of an apparatus according to the present invention.
Figure 14B:
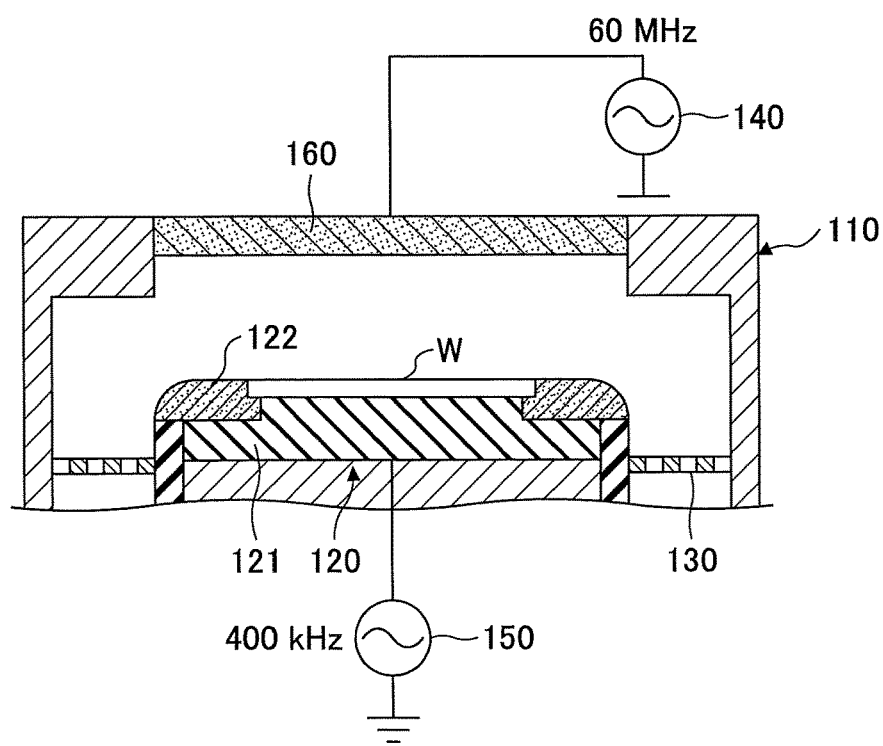

Referring to FIGS. 13 and 14A-14B, results of the test 8 indicating a change of a state of a film depending on a difference of a plasma processing apparatus performing a film deposition method of the embodiment are described. FIG. 13 illustrates examples of experimental results of apparatus dependence of a film by a film deposition method according to this embodiment. FIGS. 14A and 14B illustrate a schematic structure of an apparatus. Film deposition conditions 8-1, 8-2, and 8-3 in each apparatus of the test 8 are as follows.

(Film Deposition Condition 8-1: FIGS. 13, (a) and (c))
Used apparatus: inductively coupled plasma (ICP) apparatus (see FIG. 1)
Chamber internal pressure: 50 mT, 100 mT
Gaseous species: $C_4F_6$, 300 sccm
Stage temperature: −50° C.
Power of high frequency HF: 300 W
Power of high frequency LF: 0 W
film deposition time: 10 sec, 5 sec (Film Deposition Condition 8-2: FIGS. 13, (b))
Used apparatus: Capacitive coupled plasma (CCP) apparatus with two frequencies from a lower part (see FIG. 14A)
Chamber internal pressure: 50 mT
Gaseous species: $C_4F_6$, 80 sccm
Stage temperature: −50° C.
Power of high frequency HF (100 MHz): 300 W
Power of high frequency LF: 0 W
film deposition time: 20 sec (Film Deposition Condition 8-3: FIGS. 13, (d))
Used apparatus: Capacitive coupled plasma (CCP) apparatus with two frequencies from an upper part and a lower part (see FIG. 14B)
Chamber internal pressure: 100 mT
Gaseous species: $C_4F_6$, 150 sccm
Stage temperature: −50° C.
Power of high frequency HF (60 MHz): 300 W
Power of high frequency LF: 0 W
film deposition time: 20 sec The structures of these apparatuses are briefly described. As illustrated in FIG. 14A, a stage 120 is disposed inside a chamber 110 in the Capacitive coupled plasma (CCP) apparatus with two frequencies from the lower part. An electrostatic chuck 121 for holding a wafer W is provided on the upper surface of the stage 120. A focus ring 122 annularly surrounding the periphery of the wafer W is disposed on an outer peripheral side of the electrostatic chuck 121.

An annular evacuation path is formed between an inner wall of the chamber 10 and a side wall of the stage 120. An annular baffle plate 130 is attached to an upper part or an inlet of the annular evacuation path. The stage 120 is connected to a high frequency power source 140 and a second high frequency power source 150. The first high frequency power source 140 applies power of a high frequency HF for generating plasma of, for example, 100 MHz. The second high frequency power source 150 applies power of a high frequency LF for generating plasma of, for example, 400 MHz. A ceiling part of the chamber 110 opposite to the stage 120 functions as an upper electrode 160.

As illustrated in FIG. 14B, the capacitive coupled plasma (CCP) apparatus with two frequencies from the upper part and the lower part substantially has the same structure as the capacitive coupled plasma (CCP) apparatus with two frequencies from the lower part. Only the arrangement of the first high frequency power source 140 is different. Said differently, in the capacitive coupled plasma (CCP) apparatus with two frequencies from the upper part and the lower part, the first high frequency power source 140 is connected to the upper electrode 160. The first high frequency power source 140 applies power of a high frequency HF for generating plasma of, for example, 100 MHz.

Referring back to (a) and (c) of FIG. 13, according to the results of the tests, in a case where the ICP apparatus is used and the chamber internal pressure is set to be either 50 mT or 100 mT, the flowable organic film R is deposited from bottom up on the recess part. Referring to (d) of FIG. 13, in a case where the capacitive coupled plasma (CCP) apparatus with two frequencies from the upper part and the lower part is used, the flowable organic film R is deposited from bottom up on the recess part.

Referring to (b) of FIG. 13, in a case where the capacitive coupled plasma (CCP) apparatus with two frequencies from the lower part is used, the void V is generated to prevent the flowable organic film R from completely filling the recess part. This is because, in a case where the capacitive coupled plasma (CCP) apparatus with two frequencies from the lower part is used, the power of the high frequency HF is applied on a side of the stage 120 to cause plasma to be generated near the wafer on the stage. Therefore, a function (biasing) of ions inside the plasma is apt to be applied to the wafer W. Therefore, it is assumed that the film is isotropically deposited on the top of the SiN film by the function of ions inside plasma, the void V is generated, and the recess part is not completely filled with the flowable organic film R.

On the contrary, in a case where the ICP apparatus or the capacitive coupled plasma (CCP) apparatus with two frequencies from the upper part and the lower part is used, plasma is generated on a side of the upper electrode 160. With this, the function (biasing) of ions inside plasma is hardly applied to the wafer. Therefore, it is assumed that the void V is not generated, and the flowable organic film R is deposited from bottom up.

The plasma processing apparatus performing the film deposition method of the embodiment is not limited to an inductively-coupled type plasma processing apparatus (an ICP apparatus) or the capacitive coupled plasma (CCP) apparatus with two frequencies from the upper part and the lower part, in which the high frequency power for generating plasma is applied on the side of the upper electrode but any one of a plasma processing apparatus and a remote plasma apparatus.

As described above, according to a film deposition method of the embodiment, by making the film deposition condition appropriate, the recess part of the object to be processed can be completely filled with a predetermined deposited material.

All examples and conditional language recited herein are intended for pedagogical purposes to aid the reader in understanding the invention embodiments and the concepts contributed by the inventor to furthering the art, and are to be construed as being without limitation to such specifically recited examples and conditions, nor does the organization of such examples in the specification relate to a showing of superiority or inferiority of the invention embodiments. Although the film deposition method of the present invention has been described in detail, it should be understood that the various changes, substitutions, and alterations could be made hereto without departing from the spirit and scope of the invention.

For example, the wafer W is mentioned in this specification as an example. However, the object to be processed is not limited to the above and may be various boards used for a Liquid Crystal Display (LCD) or a Flat Panel Display (FPD), a photomask, a CD substrate, or a printed wiring board.

What is claimed is:

1. A film deposition method comprising. mounting an object to be processed on a stage, said object including a recess part;
   maintaining an inside of a chamber to have a predetermined pressure and cooling the stage below −20° C.;
   supplying only a low-vapor-pressure material selected from the group consisting of $C_4F_8$, $C_4F_6$, and isopropyl alcohol (IPA); and
   generating plasma from the supplied gas including the low-vapor-pressure material, thereby causing a precursor generated only from the low-vapor-pressure material by the plasma to be deposited on the recess part of the object to be processed, wherein the predetermined pressure inside the chamber is between 50 mTorr (6.67 Pa) and the equilibrium vapor pressure of $C_4F_8$ at the temperature of the supplied gas, and wherein the causing the precursor generated from the low-vapor-pressure material to be deposited is to deposit the precursor on the recess part, thereby filling the recess part with a flowable organic film, said flowable organic film being free of Si.

2. The film deposition method according to claim 1, wherein the gas including the low-vapor-pressure material is a carbon-containing gas.

3. The film deposition method according to claim 1, wherein an aspect ratio of the recess part is 2 or greater.

4. The film deposition method according to claim 1, wherein as an aspect ratio of the recess part formed in the object to be processed becomes higher, a film deposition speed of depositing the precursor becomes higher.

5. The film deposition method according to claim 1, the film deposition method further comprising:
   completely filling an inside of the recessed part with the flowable organic film and then depositing over the recessed part with more of the flowable organic film.

6. The film deposition method according to claim 1, wherein the film deposition speed in the recessed part formed in the object to be processed is faster than a film deposition speed in a fat part of the object to be processed.

7. The film deposition method according to claim 1, the film deposition method further comprising:
   applying high frequency power for a plasma generation to an inside of the chamber and high frequency power for a pull-in of a bias so that ion energy becomes 0 V or higher and 1000 V or lower.

8. The film deposition method according to claim 1,
   wherein the gas including the low-vapor-pressure material includes an inert gas, and
   wherein a ratio of a flow rate of the gas including the low-vapor-pressure material relative to a flow rate of the inert gas is 50% or less.

9. The film deposition method according to claim 1,
   wherein the film deposition method is performed by any one of an inductively-coupled type plasma processing apparatus, a capacitive coupled plasma processing apparatus applying high frequency power for generating plasma on a side on an upper electrode, a microwave plasma processing apparatus, and a remote plasma apparatus.

10. The film deposition method according to claim 1, wherein the recess part is formed and defined by etching the object to have a predetermined pattern.

11. A film deposition method comprising:
   mounting an object on a stage, said object including a recess;
   cooling the stage below −20° C.;
   supplying, into the inside of a chamber, only a first gas consisting of:
      an inert gas, and
      a second gas selected from the group consisting of $C_4F_8$, $C_4F_6$ and isopropyl alcohol (IPA);
   adjusting a pressure within the chamber between 50 mTorr (6.67 Pa) and an equilibrium vapor pressure of $C_4F_8$ at a given temperature of the gas;
   depositing a flowable organic film in the recess and filling the recess with the flowable organic film by generating plasma only from the first gas.

12. The film deposition method of claim 11, wherein the flowable organic film is a Si-free organic film.

13. A film deposition method comprising:
   mounting an object on a stage, said object including a recess;
   cooling the stage below −20° C.;
   supplying, into the inside of a chamber, a gas including at least one selected from the group consisting of $C_4F_8$, $C_4F_6$, and isopropyl alcohol (IPA);
   adjusting a pressure within the chamber between 50 mTorr (6.67 Pa) and an equilibrium vapor pressure of $C_4F_8$ at a given temperature of the gas;
   depositing a flowable organic film in the recess and filling the recess with the flowable organic film by generating plasma from the gas,. wherein the flowable organic film is a Si-free organic film.

* * * * *